US012598743B2

(12) United States Patent
Okada et al.

(10) Patent No.: US 12,598,743 B2
(45) Date of Patent: Apr. 7, 2026

(54) MEMORY CELL, NONVOLATILE SEMICONDUCTOR STORAGE DEVICE, AND METHOD FOR MANUFACTURING NONVOLATILE SEMICONDUCTOR STORAGE DEVICE

(71) Applicant: Floadia Corporation, Kodaira (JP)

(72) Inventors: Daisuke Okada, Kodaira (JP); Kazumasa Yanagisawa, Kodaira (JP); Fukuo Owada, Kodaira (JP); Shoji Yoshida, Kodaira (JP); Yasuhiko Kawashima, Kodaira (JP); Shinji Yoshida, Kodaira (JP); Yasuhiro Taniguchi, Kodaira (JP); Kosuke Okuyama, Kodaira (JP)

(73) Assignee: Floadia Corporation, Tokyo (JP)

( * ) Notice: Subject to any disclaimer, the term of this patent is extended or adjusted under 35 U.S.C. 154(b) by 231 days.

(21) Appl. No.: 17/232,824

(22) Filed: Apr. 16, 2021

(65) Prior Publication Data

US 2021/0257376 A1 Aug. 19, 2021

Related U.S. Application Data

(62) Division of application No. 16/434,373, filed on Jun. 7, 2019, now Pat. No. 11,011,530, which is a division
(Continued)

(30) Foreign Application Priority Data

Dec. 18, 2015 (JP) ................................. 2015-247812
Aug. 24, 2016 (JP) ................................. 2016-164002

(51) Int. Cl.
*H10B 41/30* (2023.01)
*G11C 16/02* (2006.01)
(Continued)

(52) U.S. Cl.
CPC ............. *H10B 41/30* (2023.02); *G11C 16/04* (2013.01); *H10B 41/35* (2023.02); *H10B 43/30* (2023.02);
(Continued)

(58) Field of Classification Search
CPC ...... H01L 29/42344; H01L 21/823821; H10B 43/00–50; H10B 12/36; H10B 12/056;
(Continued)

(56) References Cited

U.S. PATENT DOCUMENTS

2007/0054448 A1* 3/2007 Choi ................. H01L 29/42348
257/E21.21
2007/0075372 A1 4/2007 Terashima et al.
(Continued)

FOREIGN PATENT DOCUMENTS

JP 2009-259865 A 11/2009
JP 2010-186853 A 8/2010
(Continued)

OTHER PUBLICATIONS

International Search Report issued in Patent Application No. PCT/JP2016/086355 dated Feb. 21, 2017.
(Continued)

*Primary Examiner* — Amar Movva
(74) *Attorney, Agent, or Firm* — McDonald Hopkins LLC

(57) ABSTRACT

In a semiconductor memory device, voltage application from a memory gate electrode of the memory capacitor to a word line can be blocked by a rectifier element depending on values of voltages applied to the memory gate electrode and the word line without using a conventional control circuit. The configuration eliminates the need to provide a switch transistor and a switch control circuit for turning on and off the switch transistor as in conventional cases, and accordingly achieves downsizing. In the semiconductor memory
(Continued)

device, for example, each bit line contact is shared by four anti-fuse memories adjacent to each other and each word line contact is shared by four anti-fuse memories adjacent to each other, thereby achieving downsizing of the entire device as compared to a case in which the bit line contact and the word line contact are individually provided to each anti-fuse memory.

8 Claims, 21 Drawing Sheets

Related U.S. Application Data of application No. 15/578,413, filed as application No. PCT/JP2016/086355 on Dec. 7, 2016, now Pat. No. 10,373,967.

(51) Int. Cl.

| | |
|---|---|
| *G11C 16/04* | (2006.01) |
| *G11C 16/10* | (2006.01) |
| *H10B 41/10* | (2023.01) |
| *H10B 41/35* | (2023.01) |
| *H10B 43/10* | (2023.01) |
| *H10B 43/30* | (2023.01) |
| *H10B 43/35* | (2023.01) |
| *H10B 69/00* | (2023.01) |
| *H10D 30/01* | (2025.01) |
| *H10D 30/62* | (2025.01) |
| *H10D 30/68* | (2025.01) |
| *H10D 30/69* | (2025.01) |
| *H10D 64/01* | (2025.01) |
| *H10D 84/01* | (2025.01) |
| *H10D 84/03* | (2025.01) |

(52) U.S. Cl.
CPC ............. *H10B 43/35* (2023.02); *H10B 69/00* (2023.02); *H10D 30/0243* (2025.01); *H10D 30/62* (2025.01); *H10D 30/68* (2025.01); *H10D 30/69* (2025.01); *H10D 30/696*
(2025.01); *H10D 64/017* (2025.01); *H10D 64/037* (2025.01); *H10D 84/0193* (2025.01); *H10D 84/038* (2025.01); *G11C 16/02* (2013.01); *G11C 16/0433* (2013.01); *G11C 16/10* (2013.01); *H10B 41/10* (2023.02); *H10B 43/10* (2023.02)

(58) Field of Classification Search
CPC ....... H10D 64/037; H10D 30/62–6219; H10D 30/024–0245; H10D 84/0158; H10D 84/834; H10D 84/853; H10D 86/011; H10D 86/215
See application file for complete search history.

(56) References Cited

U.S. PATENT DOCUMENTS

| | | | | |
|---|---|---|---|---|
| 2009/0256208 | A1 | 10/2009 | Okano | |
| 2010/0203704 | A1 | 8/2010 | Inumiya et al. | |
| 2011/0147848 | A1 | 6/2011 | Kuhn et al. | |
| 2011/0233649 | A1* | 9/2011 | Shimizu | .............. H01L 29/6653 |
| | | | | 257/E21.423 |
| 2013/0015520 | A1* | 1/2013 | Shosuke | ........... H01L 27/11568 |
| | | | | 257/E21.423 |
| 2013/0270638 | A1* | 10/2013 | Adam | ................. H01L 29/7848 |
| | | | | 257/E21.409 |
| 2014/0008716 | A1 | 1/2014 | Arigane et al. | |
| 2014/0213030 | A1 | 7/2014 | Tsukuda et al. | |

FOREIGN PATENT DOCUMENTS

| | | |
|---|---|---|
| JP | 2010-278314 A | 12/2010 |
| JP | 2011-129816 A | 6/2011 |
| JP | 2014-017343 A | 1/2014 |
| JP | 2014-143339 A | 8/2014 |
| WO | 2005-038931 A1 | 4/2005 |

OTHER PUBLICATIONS

Written Opinion issued in Patent Application No. PCT/JP2016/086355 dated Feb. 21, 2017.

* cited by examiner

FIG. 6

| | Read | | Prog | | Erase | |
| --- | --- | --- | --- | --- | --- | --- |
| | SELECT COLUMN | NON-SELECT COLUMN | SELECT COLUMN | NON-SELECT COLUMN | | |
| ML | 0 | 0 | 12 | 12 | -12 | |
| SGL | 1.5 | 1.5 | 0 | 0 | 0 | |
| DLx | 1.5 | 1.5 | 1.5 | 1.5 | 0 | SELECT ROW |
| | 0 | 0 | 0 | 0 | 0 | NON-SELECT ROW |
| BLy | 1.5 | 0 | 0 | 1.5 | 0 | |
| SL | 0 | 0 | 0 | 0 | 0 | |
| Back | 0 | 0 | 0 | 0 | 0 | |

MEMORY CELL, NONVOLATILE SEMICONDUCTOR STORAGE DEVICE, AND METHOD FOR MANUFACTURING NONVOLATILE SEMICONDUCTOR STORAGE DEVICE

CROSS-REFERENCE TO RELATED APPLICATIONS

This is a division of U.S. patent application Ser. No. 16/434,373 filed on Jun. 7, 2019, which is a division of Ser. No. 15/578,413 filed Nov. 30, 2017 which is the national stage of PCT/JP2016/086355 filed Dec. 7, 2016, which claims priority to Japanese Patent Application 2015-247812 filed Dec. 18, 2015 and Japanese Patent Application 2016-164002 filed Aug. 24, 2016, the entireties of which are incorporated herein by reference.

TECHNICAL FIELD

The present invention relates to a memory cell, a non-volatile semiconductor storage device, and a method for manufacturing a nonvolatile semiconductor storage device.

BACKGROUND ART

Japanese Patent Laid-open No. 2011-129816 (Patent Literature 1) discloses a conventional memory cell including a memory gate structure between two select gate structures (refer to FIG. 15 in Patent Literature 1). The memory cell includes a drain region connected with a bit line, and a source region connected with a source line, and also includes a first select gate structure, a memory gate structure, and a second select gate structure sequentially disposed on a semiconductor substrate between the drain and source regions. In the memory cell having such a configuration, the memory gate structure includes a charge storage layer surrounded by an insulative material. Data is programmed by injecting charge into the charge storage layer, and is erased by removing the charge from the charge storage layer.

To inject charge into the charge storage layer of such a memory cell, low bit voltage is applied from the bit line to a channel layer below the memory gate structure through the first select gate structure while voltage is blocked by the second select gate structure connected with the source line. Simultaneously, high memory gate voltage is applied to a memory gate electrode of the memory gate structure so that charge is injected into the charge storage layer due to a quantum tunneling effect caused by a large voltage difference between the bit voltage and the memory gate voltage.

In a nonvolatile semiconductor storage device including a plurality of memory cells arranged in a matrix of rows and columns and each having the above-described configuration, a memory gate line for applying voltage to each memory gate electrode is shared by a plurality of memory cells. With the configuration, when high charge storage gate voltage is applied to the memory gate line to inject charge into the charge storage layer of a particular memory cell, the high charge storage gate voltage is also applied to the memory gate electrode of any other memory cell sharing the memory gate line.

For this reason, in a memory cell into the charge storage layer of which charge is not to be injected, for example, high bit voltage is applied to the channel layer below the memory gate structure to reduce a voltage difference between the memory gate electrode and the channel layer, thereby preventing charge injection into the charge storage layer when high charge storage gate voltage is applied to the memory gate line.

CITATION LIST

Patent Literature

Patent Literature 1: Japanese Patent Laid-open No. 2011-129816

SUMMARY OF INVENTION

Technical Problem

However, it is desired that, in a memory cell into the charge storage layer of which no charge is to be injected, some measures are taken not only to prevent charge injection into the charge storage layer but also to prevent a phenomenon (hereinafter referred to as disturbance) that the charge storage state of the charge storage layer varies due to unintended charge injection into the charge storage layer when high charge storage gate voltage is applied to the memory gate line.

Since such a nonvolatile semiconductor storage device includes the memory cells arranged in the matrix, it is important to achieve, simultaneously with the measures against a disturbance defect, downsizing of each memory cell so that a larger number of memory cells can be arranged in a limited area.

The present invention is thus intended to solve the above-described problem and provide a memory cell, a nonvolatile semiconductor storage device, and a method for manufacturing a nonvolatile semiconductor storage device that achieve downsizing and suppression of the occurrence of disturbance.

Solution to Problem

To solve the above-described problem, a memory cell according to the present invention includes: a semiconductor substrate covered by an insulating layer; a fin disposed on the semiconductor substrate and protruding from the insulating layer; a memory gate structure including a lower memory gate insulating film, a charge storage layer, an upper memory gate insulating film, and a memory gate electrode stacked, and being disposed on the insulating layer so as to extend over the fin; a first select gate structure that includes a first select gate electrode stacked on a first select gate insulating film, and being disposed on the insulating layer so as to extend over the fin along a first sidewall spacer disposed on one sidewall of the memory gate structure; a second select gate structure that includes a second select gate electrode stacked on a second select gate insulating film, and being disposed on the insulating layer so as to extend over the fin along a second sidewall spacer disposed on the other sidewall of the memory gate structure; a drain region provided adjacent to the first select gate structure on a surface of the fin, insulated from the first select gate electrode, and electrically connected with a bit line; and a source region provided adjacent to the second select gate structure on the surface of the fin, insulated from the second select gate electrode, and electrically connected with a source line. The first select gate structure, the memory gate structure, and the second select gate structure are provided between the drain region and the source region. A relation of Hfin>Wfin holds where Hfin represents an in-electrode protruding height of the fin as a distance between an upper surface of the fin and a bottom surface of the memory gate electrode on the insulating layer, and Wfin represents a width of the fin in a direction in which the first select gate structure and the second select gate structure extend over the fin. Charge is injected into the charge storage layer due to a quantum tunneling effect caused by voltage difference between the memory gate electrode and the fin when programming to the memory cell is selected, while charge is prevented from being injected into the charge storage layer by a depleted layer formed in the fin when programming to the memory cell is not selected.

A nonvolatile semiconductor storage device according to the present invention includes a plurality of memory cells arranged in a matrix of rows and columns and each including a memory gate electrode connected with a memory gate line. Each memory cell is the above-described memory cell. The memory gate line is shared by the memory cells arranged in the matrix.

Advantageous Effects of Invention

In a memory cell, a nonvolatile semiconductor storage device, and a method for manufacturing a nonvolatile semiconductor storage device according to the present invention, to prevent charge injection into a charge storage layer, a first select gate structure blocks electrical connection between a bit line and inside of a fin surrounded by a memory gate structure, and a second select gate structure blocks electrical connection between a source line and inside of the fin surrounded by the memory gate structure, so that a depleted layer is formed on the surface of the fin to reduce the potential difference between the memory gate electrode and the fin.

Accordingly, in the present invention, when the memory cell is downsized by reducing the distance between a drain region and a source region on the surface of the fin with high impurity concentration inside the fin, the shape of the fin is set so that the depleted layer is formed entirely inside the fin to reduce the potential difference between the memory gate electrode and the fin and reduce electric field applied to the depleted layer, thereby suppressing the occurrence of disturbance.

In the memory cell according to the present invention, the height of the fin serves as part of the gate widths of the first select gate structure, the memory gate structure, and the second select gate structure. The configuration leads to height increase by the height of the fin but also leads to reduction of the formation area of each gate width in a direction in which the gate width of the first select gate structure, the memory gate structure, and the second select gate structure extends, thereby achieving downsizing accordingly.

In the memory cell according to the present invention, charge injection into the charge storage layer can be prevented by applying, to the bit and source lines, voltage for blocking electrical connection between the bit line (source line) and the inside of the fin surrounded by the memory gate structure. Thus, the voltage applied to the bit and source lines can be reduced without restriction to charge storage gate voltage applied to the memory gate electrode in the memory cell according to the present invention. Accordingly, a first select gate insulating film of the first select gate structure and a second select gate insulating film of the second select gate structure can have reduced thicknesses to achieve fast operation.

BRIEF DESCRIPTION OF DRAWINGS

FIG. 6 is a table listing an exemplary voltage value at each site at data programming operation, data reading operation, and data erasing operation.

DESCRIPTION OF EMBODIMENTS

Hereinafter, embodiments of the present invention will be described in the following order.

<1. Outline of memory cell having fin structure>
<2. Detailed configuration of memory cell>
<3. Circuit configuration of nonvolatile semiconductor storage device>
<4. Voltage at various operations in nonvolatile semiconductor storage device>
4-1. Data programming operation
4-2. No-data programming operation
4-3. Data reading operation
4-4. Data erasing operation
<5. Potential in nonselected program memory cell in which high charge storage gate voltage is applied to memory gate electrode>
<6. Method for manufacturing a nonvolatile semiconductor storage device>
<7. Operations and effects>
<8. Other embodiments>
8-1. Configuration of memory cell including memory gate electrode, first select gate electrode, and second select gate electrode made of conductive material other than metallic material
8-2. Configuration of memory cell including cap insulating film on upper surface of fin
8-3. Others
<9. Memory cell including insulating layer having small thickness in regions in which first select gate structure and second select gate structure are provided>
9-1. Configuration of memory cell
9-2. Operations and effects
<10. Memory cell including fin on insulating layer>
10-1. Configuration of memory cell
10-2. Operations and effects
10-3. Fin according to other embodiments

(1) Outline of Memory Cell Having Fin Structure

Figure 1:
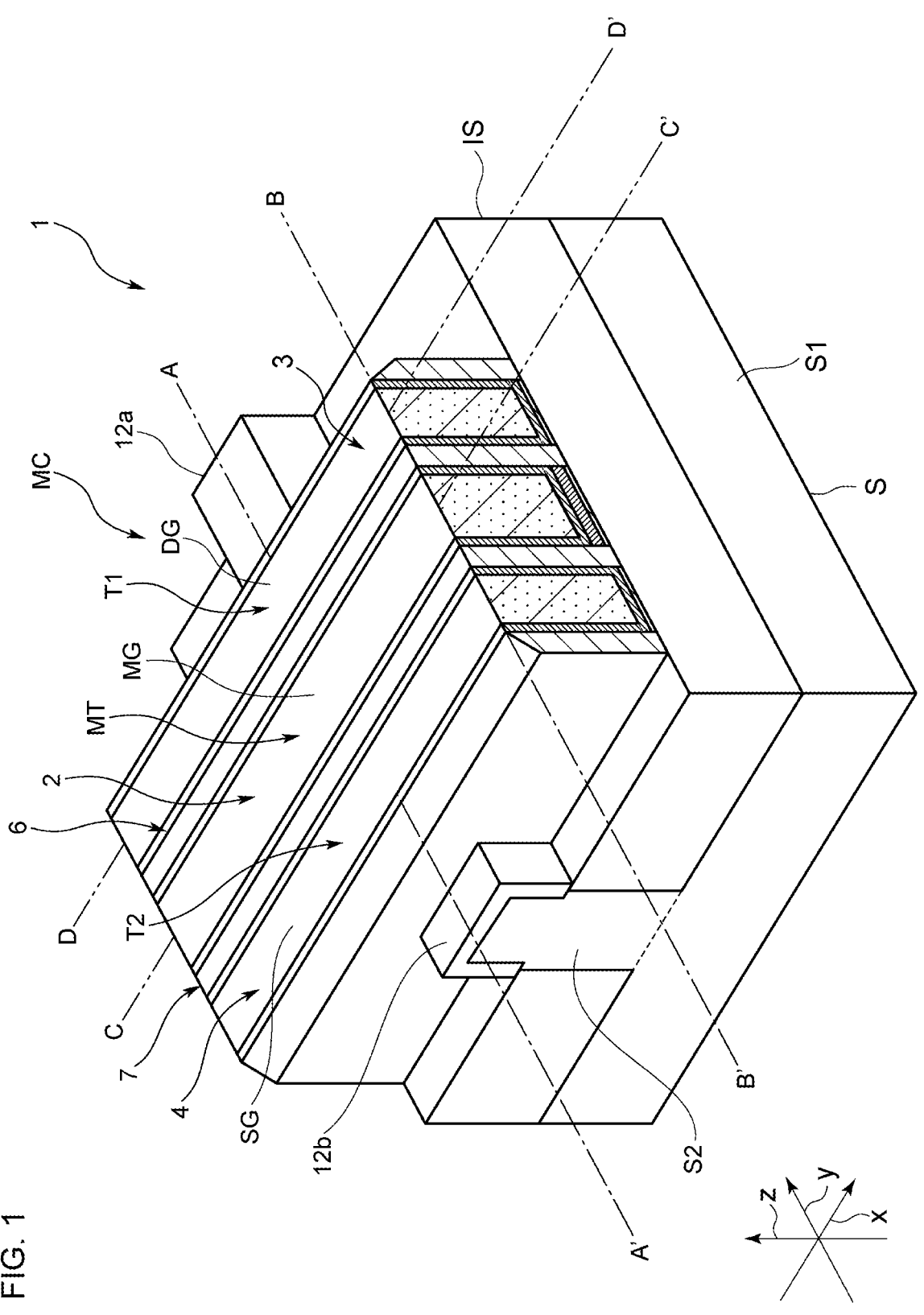
FIG. 1 is a perspective view illustrating configuration (1) of a memory cell.

FIG. 1 is a perspective view schematically illustrating a fin structure of a memory cell MC provided to a nonvolatile semiconductor storage device 1. The following first gives simple description that the memory cell MC has the configuration of a fin-type field effect transistor (FET) with reference to the perspective view in FIG. 1. In this case, the memory cell MC includes a semiconductor substrate S1 made of a semiconductor material such as silicon, and a fin S2 made of a semiconductor material same as that of the semiconductor substrate S1, integrated with the semiconductor substrate S1, and protruding from the semiconductor substrate S1.

In the memory cell MC, a surface of the semiconductor substrate S1 in a plate shape is covered by an insulating layer IS made of an insulative material, and the fin S2 is disposed in a vertical direction z on the semiconductor substrate S1 and partially protrudes from a surface of the insulating layer IS. The fin S2 has, for example, a rectangular parallelepiped shape with a longitudinal direction thereof extending in a y direction along the surface of the semiconductor substrate S1. In the present embodiment, for example, P-type impurities are implanted in the semiconductor substrate S1 and the fin S2.

Additionally, in the present embodiment, the memory cell MC includes a memory gate structure 2, a first select gate structure 3, and a second select gate structure 4 over the fin S2 on the insulating layer IS. The memory gate structure 2 includes an N-type memory transistor MT on the fin S2. The first select gate structure 3 includes a first select transistor T1 as an N-type MOS on the fin S2. The second select gate structure 4 includes a second select transistor T2 as an N-type MOS on the fin S2.

Detailed configurations of the memory gate structure 2, the first select gate structure 3, and the second select gate structure 4 are described later with reference to FIGS. 3 and 4 and thus not described here. Instead, the following description will be made mainly on the configuration in which the memory gate structure 2, the first select gate structure 3, and the second select gate structure 4 extend over the fin S2.

In the configuration, the memory gate structure 2, the first select gate structure 3, and the second select gate structure 4 extend on the insulating layer IS such that longitudinal directions thereof intersect with the y direction in which the fin S2 extends, and cover, in C shapes, surfaces of the fin S2. In this manner, the memory gate structure 2, the first select gate structure 3, and the second select gate structure 4 cover surfaces (facing side surfaces and an upper surface) of the fin S2 exposed on the surface of the insulating layer IS.

In the present embodiment, the memory gate structure 2, the first select gate structure 3, and the second select gate structure 4 extend side by side. An x direction in which the memory gate structure 2, the first select gate structure 3, and the second select gate structure 4 extend over the fin S2 is orthogonal to the y direction in which the fin S2 extends and a z direction as a vertical direction. The memory gate structure 2 is insulated from the first select gate structure 3 by a first sidewall spacer 6 disposed along a first sidewall, and is insulated from the second select gate structure 4 by a second sidewall spacer 7 disposed along a second sidewall.

A drain region 12*a* is provided adjacent to the first select gate structure 3 on a surface of the fin S2, insulated from a first select gate electrode DG of the first select gate structure 3, and connected with a bit line (not illustrated). A source region 12*b* is provided adjacent to the second select gate structure 4 on the surface of the fin S2, insulated from a second select gate electrode SG of the second select gate structure 4, and connected with a source line (not illustrated).

(2) Detailed Configuration of Memory Cell

Figure 2:
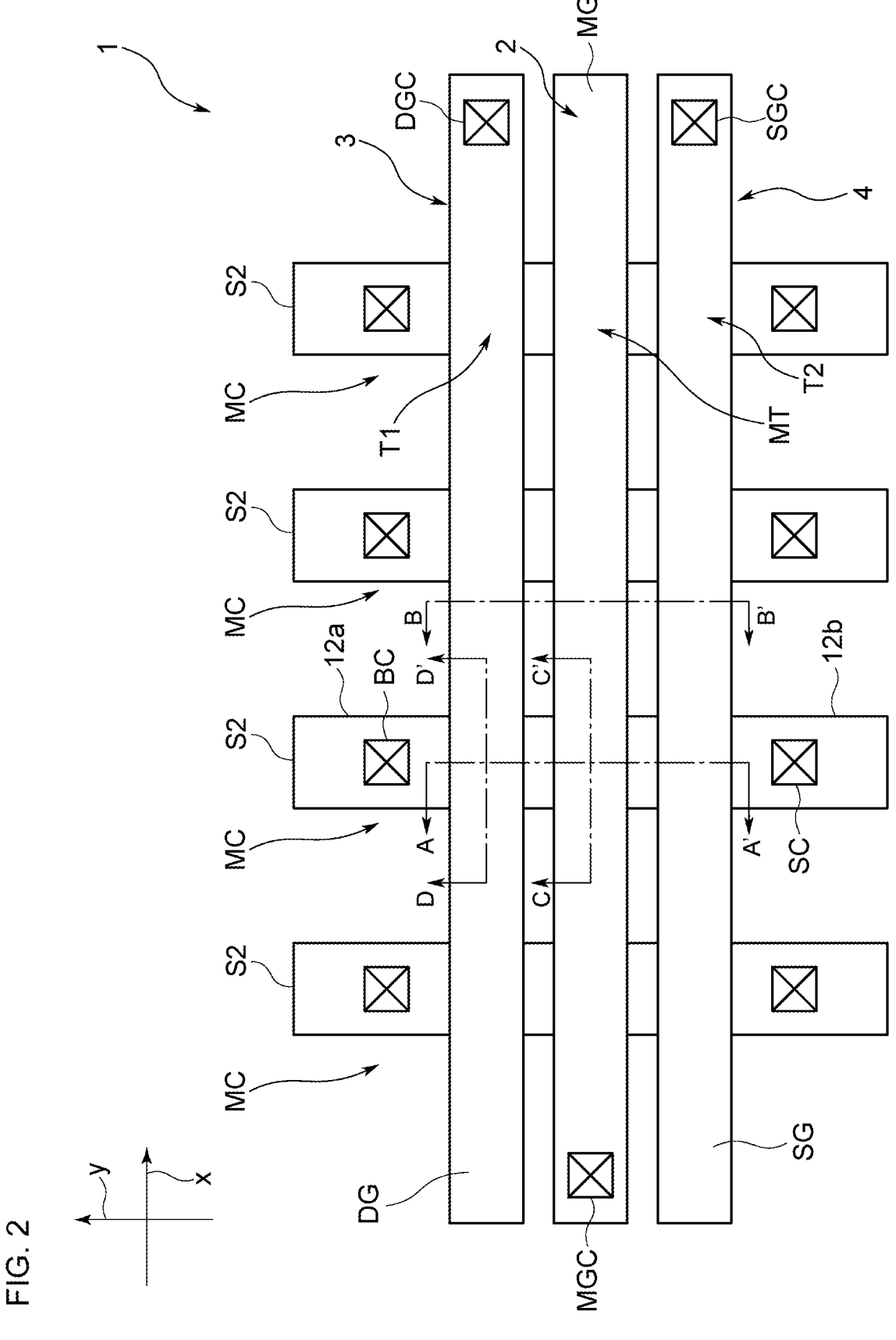
FIG. 2 is a schematic view illustrating a planar layout of a nonvolatile semiconductor storage device.
Figures 3A, 3B:
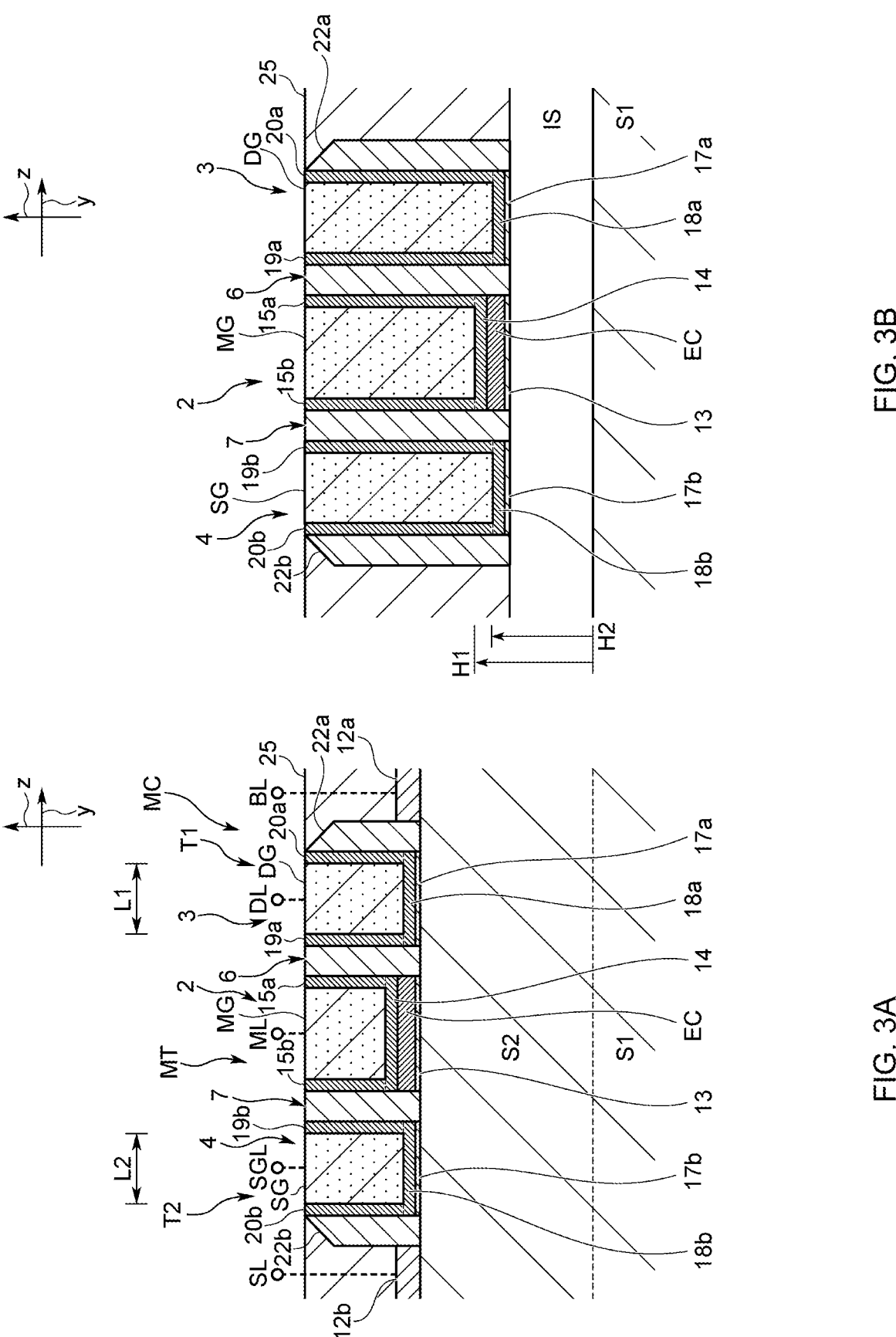
FIG. 3A is a schematic view illustrating a sectional configuration taken along line A-A' in FIG. 2.
FIG. 3B is a schematic view illustrating a sectional configuration taken along line B-B' in FIG. 2.
Figure 4B:
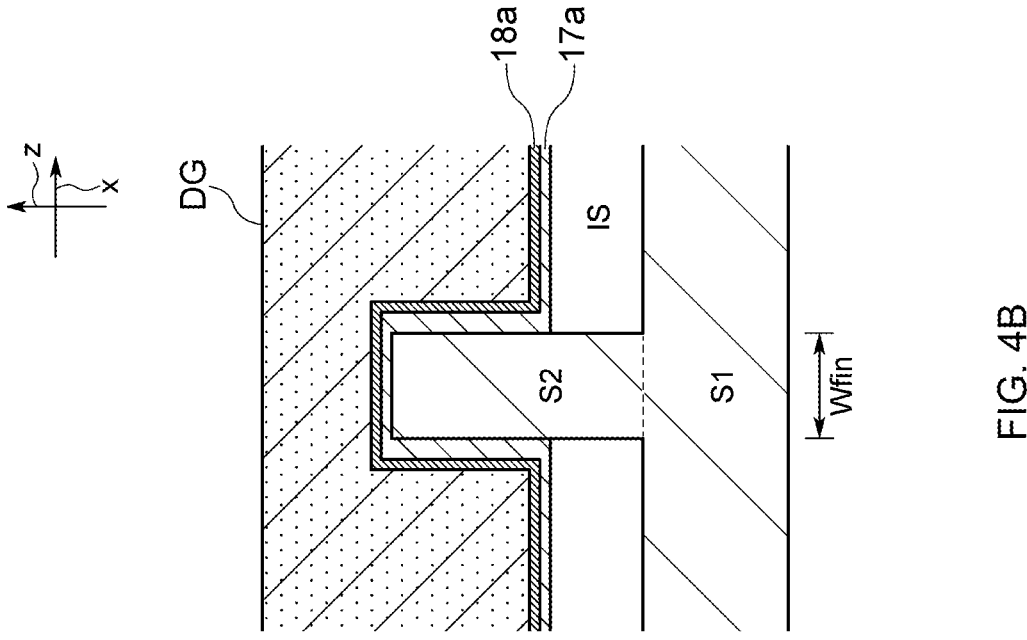
FIG. 4B is a schematic view illustrating a sectional configuration of the memory cell taken along line D-D' in FIG. 2.
Figure 4A:
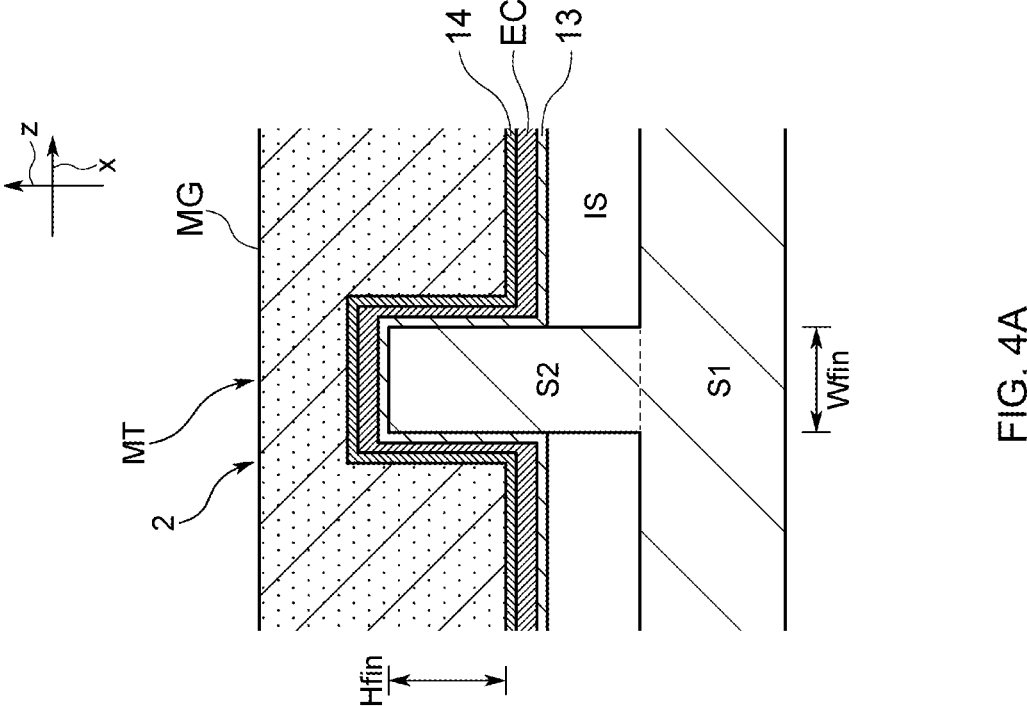
FIG. 4A is a schematic view illustrating a sectional configuration of the memory cell taken along line C-C' in FIG. 2.

The following describes a detailed configuration of the memory cell MC with reference to FIGS. 2, 3A, 3B, 4A, and 4B. FIG. 2 illustrates a planar layout of the nonvolatile semiconductor storage device 1 including, for example, the four memory cells MC arranged in the x direction. FIG. 3A illustrates a sectional configuration taken along line A-A' in FIGS. 1 and 2. FIG. 3B illustrates a sectional configuration taken along line B-B' in FIGS. 1 and 2. FIG. 4A illustrates a sectional configuration taken along line C-C' in FIGS. 1 and 2. FIG. 4B illustrates a sectional configuration taken along line D-D' in FIGS. 1 and 2.

FIG. 2 mainly illustrates the fin S2, the memory gate structure 2, the first select gate structure 3, and the second select gate structure 4, and omits, for example, the sidewall spacer 6 between the memory gate structure 2 and the first select gate structure 3, and the sidewall spacer 7 between the memory gate structure 2 and the second select gate structure 4, which are illustrated in FIG. 1.

In this case, as illustrated in FIG. 2, the nonvolatile semiconductor storage device 1 includes a plurality of the fins S2 extending side by side in the y direction and including the respective memory cells MC. The memory gate structure 2, the first select gate structure 3, and the second select gate structure 4 extending side by side in the nonvolatile semiconductor storage device 1 intersect with the y direction in which each fin S2 extends. Each memory cell MC including the memory transistor MT, the first select transistor T1, and the second select transistor T2 is formed in a region in which the memory gate structure 2, the first select gate structure 3, and the second select gate structure 4 extend over the fin S2.

The nonvolatile semiconductor storage device 1 includes a memory gate contact MGC connected with a memory gate line (not illustrated) and provided at a predetermined position on an upper surface of a memory gate electrode MG of the memory gate structure 2. With the configuration, memory gate voltage applied to the memory gate line is applied to the memory gate electrode MG shared by the memory cells MC through the memory gate contact MGC.

The nonvolatile semiconductor storage device 1 also includes a first select gate contact DGC connected with a first select gate line (not illustrated) and provided at a predetermined position on an upper surface of the first select gate electrode DG of the first select gate structure 3. With the configuration, voltage applied to the first select gate line is applied to the first select gate electrode DG shared by the memory cells MC through the first select gate contact DGC.

The nonvolatile semiconductor storage device 1 also includes a second select gate contact SGC connected with a second select gate line (not illustrated) and provided at a predetermined position on an upper surface of the second select gate electrode SG of the second select gate structure 4. With the configuration, voltage applied to the second select gate line is applied to the second select gate electrode SG shared by the memory cells MC through the second select gate contact SGC.

The drain region 12a, which is provided on the surface of the fin S2 adjacent to the first select gate structure 3, includes a bit contact BC connected with the bit line (not illustrated). With the configuration, bit voltage applied to the bit line is applied to the drain region 12a of the memory cell MC through the bit contact BC.

The source region 12b, which is provided on the surface of the fin S2 adjacent to the second select gate structure 4, includes a source contact SC connected with the source line (not illustrated). With the configuration, source voltage applied to the source line is applied to the source region 12b of the memory cell MC through the source contact SC.

As illustrated in FIG. 3A of the sectional configuration taken along line A-A' in FIGS. 1 and 2, the memory cell MC includes a sidewall part 22a made of an insulative material such as oxide silicon (SiO or $SiO_2$) along a sidewall of the first select gate structure 3. The drain region 12a is formed on the surface of the fin S2 adjacent to the sidewall part 22a. The drain region 12a is insulated from the first select gate electrode DG of the first select gate structure 3 by the sidewall part 22a between the first select gate structure 3 and the drain region 12a.

The memory cell MC also includes a sidewall part 22b made of an insulative material such as oxide silicon (SiO or $SiO_2$) along a sidewall of the second select gate structure 4. The source region 12b is formed on the surface of the fin S2 adjacent to the sidewall part 22b. The source region 12b is insulated from the second select gate electrode SG of the second select gate structure 4 by the sidewall part 22b between the second select gate structure 4 and the source region 12b.

In the present embodiment, the drain region 12a and the source region 12b, which are provided on the surface of the fin S2 with a predetermined interval therebetween, are made of a semiconductor material such as SiGe, selectively formed on the surface of the fin S2 by epitaxy, and have predetermined thicknesses.

The memory gate structure 2 includes a charge storage layer EC made of, for example, silicon nitride ($Si_3N_4$), silicon oxynitride (SiON), alumina ($Al_2O_3$), or hafnium oxide ($HfO_2$) on the fin S2 between the drain region 12a and the source region 12b through a lower memory gate insulating film 13 made of an insulative material such as oxide silicon (SiO or $SiO_2$). The memory gate structure 2 further includes the memory gate electrode MG on the charge storage layer EC through an upper memory gate insulating film 14 made of an insulative material (for example, a high-k material such as hafnium oxide ($HfO_2$), or nitrided hafnium silicate (HfSiON)) different from that of the lower memory gate insulating film 13. In the memory gate structure 2 thus configured, the charge storage layer EC is insulated from the fin S2 and the memory gate electrode MG by the lower memory gate insulating film 13 and the upper memory gate insulating film 14.

The memory gate electrode MG is made of a metallic material such as aluminum (Al), titanium aluminide (TiAl), tantalum carbide (TaC), or tantalum silicon nitride (TaSiN), and has an upper surface flattened through flattening processing such as CMP performed in a manufacturing process. The memory gate electrode MG is connected with a memory gate line ML to receive predetermined voltage application from the memory gate line ML.

The memory gate structure 2, which includes the wall-shaped sidewall spacer 6 made of an insulative material and disposed along the first sidewall, is adjacent to the first select gate structure 3 through the sidewall spacer 6. In the present embodiment, the memory gate structure 2 includes a wall-shaped memory gate sidewall insulating film 15a integrated with one end of the upper memory gate insulating film 14 along a first sidewall of the memory gate electrode MG. The sidewall spacer 6 is disposed along sidewalls of the memory gate sidewall insulating film 15a, the upper memory gate insulating film 14, the charge storage layer EC, and the lower memory gate insulating film 13. The memory gate sidewall insulating film 15a in the memory gate structure 2 is made of an insulative material (for example, a high-k material) same as that of the upper memory gate insulating film 14 and formed through a manufacturing process same as that for the upper memory gate insulating film 14.

The sidewall spacer 6 between the memory gate structure 2 and the first select gate structure 3 has a predetermined thickness large enough to insulate the memory gate electrode MG from the first select gate electrode DG together with the memory gate sidewall insulating film 15a inside the memory gate structure 2 and a first select gate sidewall insulating film 19a inside the first select gate structure 3 to be described later.

In this case, the sidewall spacer 6 is made of an insulative material such as oxide silicon (SiO or $SiO_2$), which is different from insulative materials (for example, high-k materials) of the memory gate sidewall insulating film 15a inside the memory gate structure 2 and the first select gate sidewall insulating film 19a inside the first select gate structure 3. The sidewall spacer 6 has an upper surface flattened through the flattening processing such as CMP performed in the manufacturing process.

When the distance between the memory gate electrode MG and the first select gate electrode DG is shorter than 5 nm, predetermined voltage application to the memory gate electrode MG and the first select gate electrode DG potentially generates breakdown voltage to the memory gate sidewall insulating film 15a, the sidewall spacer 6, and the first select gate sidewall insulating film 19a.

When the distance between the memory gate electrode MG and the first select gate electrode DG exceeds 40 nm, the fin S2 (for example, a region (surface region) up to a depth of 50 nm from the surface) has an increased resistance between the memory gate electrode MG and the first select gate electrode DG enough to encumber flow of readout current between the memory gate structure 2 and the first select gate structure 3 at data reading.

Thus, in the present embodiment, the distance between the memory gate electrode MG and the first select gate electrode DG is desirably 5 nm to 40 nm inclusive, and accordingly, the memory gate sidewall insulating film 15a, the sidewall spacer 6, and the first select gate sidewall insulating film 19a desirably have a total thickness of 5 nm to 40 nm inclusive.

In addition, the sidewall spacer 6 is desirably made of an insulative material having a specific dielectric constant smaller than those of the memory gate sidewall insulating film 15a and the first select gate sidewall insulating film 19a. In this case, capacitance is reduced between the first select gate structure 3 and the memory gate structure 2, thereby achieving an increased access speed.

The first select gate structure 3 includes a lower first select gate insulating film 17a made of an insulative material such as oxide silicon (SiO or $SiO_2$) on the fin S2 between the sidewall spacer 6 and the sidewall part 22a. The first select gate structure 3 further includes, on the lower first select gate insulating film 17a, an upper first select gate insulating film 18a made of an insulating material (for example, a high-k material) different from that of the first select gate insulating film 17a.

In the first select gate structure 3, the first select gate sidewall insulating film 19a wall-shaped along the sidewall spacer 6 and a sidewall-part sidewall insulating film 20a wall-shaped along the sidewall of the sidewall part 22a are integrated with the upper first select gate insulating film 18a. Similarly to the upper first select gate insulating film 18a, the first select gate sidewall insulating film 19a and the sidewall-part sidewall insulating film 20a are each made of an insulative material (for example, a high-k material) different from those of the lower first select gate insulating film 17a and the sidewall spacer 6. Accordingly, the first select gate sidewall insulating film 19a and the sidewall-part sidewall insulating film 20a are formed together with the upper first select gate insulating film 18a through the same manufacturing process. The lower first select gate insulating film 17a and the upper first select gate insulating film 18a have a total thickness of less than or equal to 9 nm, preferably less than or equal to 3 nm.

Additionally, in the first select gate structure 3, the first select gate electrode DG is disposed on the upper first select gate insulating film 18a and has sidewalls along which the first select gate sidewall insulating film 19a and the sidewall-part sidewall insulating film 20a are disposed.

The first select gate electrode DG is made of a metallic material (for example, aluminum (Al), titanium aluminide (TiAl), tantalum carbide (TaC), or tantalum silicon nitride (TaSiN)) same as that of the memory gate electrode MG, and has an upper surface flattened through the flattening processing such as CMP performed in the manufacturing process. The first select gate electrode DG is connected with the first select gate line DL to receive predetermined voltage application from the first select gate line DL.

The memory gate structure 2, which includes the wall-shaped sidewall spacer 7 made of an insulative material and disposed along the second sidewall, is adjacent to the second select gate structure 4 through the sidewall spacer 7. In the present embodiment, the memory gate structure 2 also includes a wall-shaped memory gate sidewall insulating film 15b integrated with the other end of the upper memory gate insulating film 14 along a second sidewall of the memory gate electrode MG. The second sidewall spacer 7 is disposed along sidewalls of the memory gate sidewall insulating film 15b, the upper memory gate insulating film 14, the charge storage layer EC, and the lower memory gate insulating film 13. The memory gate sidewall insulating film 15b in the memory gate structure 2 is made of an insulative material (for example, a high-k material) same as those of the upper memory gate insulating film 14 and the memory gate sidewall insulating film 15a, and formed through a manufacturing process same as that for the upper memory gate insulating film 14 and the memory gate sidewall insulating film 15a.

The sidewall spacer 7 between the memory gate structure 2 and the second select gate structure 4 has a thickness same as that of the first sidewall spacer 6, which is large enough to insulate the memory gate electrode MG from the second select gate electrode SG together with the memory gate sidewall insulating film 15b inside the memory gate structure 2 and a second select gate sidewall insulating film 19b inside the second select gate structure 4 to be described later.

In this case, the sidewall spacer 7 is made of an insulative material such as oxide silicon (SiO or $SiO_2$) same as that of the first sidewall spacer 6, and has an upper surface flattened through the flattening processing such as CMP performed in the manufacturing process.

Similarly to the distance between the memory gate electrode MG and the first select gate electrode DG described above, the distance between the memory gate electrode MG and the second select gate electrode SG is desirably 5 nm to 40 nm inclusive to avoid generation of breakdown voltage to the memory gate sidewall insulating film 15b, the sidewall spacer 7, and the second select gate sidewall insulating film 19b, and decrease of readout current between the memory gate structure 2 and the second select gate structure 4, which would otherwise occur.

Thus, the memory gate sidewall insulating film 15b, the sidewall spacer 7, and the second select gate sidewall insulating film 19b desirably have a total thickness of 5 nm to 40 nm inclusive. The second sidewall spacer 7 is desirably made of an insulative material having a specific dielectric constant smaller than those of the memory gate sidewall insulating film 15b and the second select gate sidewall insulating film 19b. In this case, capacitance is reduced between the second select gate structure 4 and the memory gate structure 2, thereby achieving an increased access speed.

The second select gate structure 4 includes a lower second select gate insulating film 17b made of an insulative material such as oxide silicon (SiO or SiO$_2$) on the fin S2 between the sidewall spacer 7 and the sidewall part 22b. The second select gate structure 4 further includes, on the lower second select gate insulating film 17b, an upper second select gate insulating film 18b made of an insulating material (for example, a high-k material) different from that of the second select gate insulating film 17b.

In the second select gate structure 4, the second select gate sidewall insulating film 19b wall-shaped along the sidewall spacer 7 and a sidewall-part sidewall insulating film 20b wall-shaped along a sidewall of the sidewall part 22b are integrated with the upper second select gate insulating film 18b. Similarly to the upper second select gate insulating film 18b, the second select gate sidewall insulating film 19b and the sidewall-part sidewall insulating film 20b are each made of an insulative material (for example, a high-k materials) different from those of the lower second select gate insulating film 17b and the sidewall spacer 7. Accordingly, the second select gate sidewall insulating film 19b and the sidewall-part sidewall insulating film 20b are formed together with the upper second select gate insulating film 18b through the same manufacturing process. The lower second select gate insulating film 17b and the upper second select gate insulating film 18b have a total thickness of less than or equal to 9 nm, preferably less than or equal to 3 nm.

Additionally, in the second select gate structure 4, the second select gate electrode SG is disposed on the upper second select gate insulating film 18b and has sidewalls along which the second select gate sidewall insulating film 19b and the sidewall-part sidewall insulating film 20b are disposed.

The second select gate electrode SG is made of a metallic material (for example, aluminum (Al), titanium aluminide (TiAl), tantalum carbide (TaC), or tantalum silicon nitride (TaSiN)) same as that of the memory gate electrode MG, and has an upper surface flattened through the flattening processing such as CMP performed in the manufacturing process. The second select gate electrode SG is connected with the second select gate line SGL to receive predetermined voltage application from the second select gate line SGL.

Since the memory gate structure 2, the first select gate structure 3, the second select gate structure 4, and the sidewall spacers 6 and 7 of the memory cell MC have the flattened upper surfaces at identical heights, the configuration with no protruding region facilitates fabrication of an upper layer.

Since the memory gate electrode MG, the first select gate electrode DG, and the second select gate electrode SG of the memory cell MC are each made of a predetermined metallic material, the configuration prevents depletion inside the memory gate electrode MG, the first select gate electrode DG, and the second select gate electrode SG.

In the nonvolatile semiconductor storage device 1, for example, the vicinities and the upper surfaces of the memory cell MC, the insulating layer IS on the semiconductor substrate S1, the fin S2 protruding from the insulating layer IS are covered by an interlayer insulating layer 25 made of an insulative material such as oxide silicon (SiO or SiO$_2$) and an interlayer insulating layer (not illustrated) thereabove.

The following describes FIG. 3B illustrating the sectional configuration taken along line B-B' in FIGS. 1 and 2. As illustrated in FIG. 3B, the memory gate structure 2, the first select gate structure 3, the second select gate structure 4, the sidewall spacers 6 and 7, and the sidewall parts 22a and 22b illustrated in FIG. 3A are disposed where the fin S2 is not disposed on the insulating layer IS covering the semiconductor substrate S1. The upper surfaces of the first select gate structure 3, the memory gate structure 2, and the second select gate structure 4 on the insulating layer IS are flattened at heights same as those of the first select gate structure 3, the memory gate structure 2, and the second select gate structure 4 on the fin S2 illustrated in FIG. 3A.

Since the surface of the insulating layer IS is positioned lower than the surface of the fin S2 where the fin S2 is not disposed, the first select gate structure 3, the memory gate structure 2, the second select gate structure 4, the sidewall spacers 6 and 7, and the sidewall parts 22a and 22b are vertically larger there than where the fin S2 is disposed accordingly. With the configuration, the first select gate structure 3, the memory gate structure 2, the second select gate structure 4, the sidewall spacers 6 and 7, and the sidewall parts 22a and 22b have heights same as those where the fin S2 is disposed.

In the memory cell MC, a distance H1 between the surface of the semiconductor substrate S1 and a lower surface of the memory gate electrode MG is larger than a distance H2 between the surface of the semiconductor substrate S1 and lower surfaces of the first select gate electrode DG and the second select gate electrode SG by, for example, the thickness of the charge storage layer EC or more. The lower surfaces of the first select gate electrode DG and the second select gate electrode SG are positioned lower than the lower surface of the memory gate electrode MG.

In the memory cell MC thus configured, the first select transistor T1 and the second select transistor T2 in regions on the side surfaces of the fin S2 can be reliably controlled to be turned on and off by the first select gate electrode DG and the second select gate electrode SG having the lower surfaces positioned lower than the lower surface of the memory gate electrode MG. Accordingly, any false operation in the memory cell MC can be prevented at data programming and data reading.

The following describes, as a comparison to the memory cell MC, a memory cell (hereinafter referred to as a comparative example) in which, unlike the memory cell MC, the distance H1 between the surface of the semiconductor substrate S1 and the lower surface of the memory gate electrode MG is smaller than the distance H2 between the surface of the semiconductor substrate S1 and the lower surfaces of the first select gate electrode DG and the second select gate electrode SG where the fin S2 is not formed, so that the lower surfaces of the first select gate electrode DG and the second select gate electrode SG are positioned higher than the lower surface of the memory gate electrode MG.

In the comparative example, since the lower surfaces of the first select gate electrode DG and the second select gate electrode SG are positioned higher than the lower surface of the memory gate electrode MG, the first select transistor T1 and the second select transistor T2 in the regions on the side surfaces of the fin S2 cannot be reliably controlled to be turned on and off by the first select gate electrode DG and the second select gate electrode SG. In particular, in the comparative example, when gate off voltage is applied to the first select gate electrode DG and the second select gate electrode SG, a non-conductive state cannot be achieved in regions on the side surfaces of the fin S2, which are not covered by the first select gate electrode DG and the second select gate electrode SG. Accordingly, when information programmed to the memory transistor MT is a low threshold voltage Vth, leakage current flows between the drain region 12a and the source region 12b along the regions on the side surfaces of the fin S2 and potentially causes a false operation.

As illustrated in FIG. 4A of the sectional configuration taken along line C-C' in FIGS. 1 and 2, the memory gate structure 2 is disposed over the fin S2 on the insulating layer IS such that the lower memory gate insulating film 13, the charge storage layer EC, the upper memory gate insulating film 14, and the memory gate electrode MG surrounds the surface of the fin S2. With the configuration, a channel layer of the memory transistor MT is formed along the surface of the fin S2 surrounded by the memory gate structure 2.

Accordingly, the memory transistor MT of the memory gate structure 2 has a gate width along the surface of the fin S2 surrounded by the memory gate structure 2 such that the heights of the side surfaces of the fin S2 serve as part of the gate width. The configuration leads to reduction of the formation area of the memory transistor MT.

As illustrated in FIG. 4B of the sectional configuration taken along line D-D' in FIGS. 1 and 2, the first select gate structure 3 is disposed over the fin S2 on the insulating layer IS such that the lower first select gate insulating film 17a, the upper first select gate insulating film 18a, and the first select gate electrode DG surround the surface of the fin S2. With the configuration, a channel layer of the first select transistor T1 is formed along the surface of the fin S2 surrounded by the first select gate structure 3.

Accordingly, the first select transistor T1 of the first select gate structure 3 has a gate width along the surface of the fin S2 surrounded by the first select gate structure 3 such that the heights of the side surfaces of the fin S2 serve as part of the gate width. The configuration leads to reduction of the formation area of the first select transistor T1. Since the second select gate structure 4 is disposed over the fin S2 in a configuration same as that of the first select gate structure 3 illustrated in FIG. 4B, description thereof will be omitted in the following.

In the present embodiment, the memory cell MC is formed so that the relation of Hfin>Wfin holds where Hfin represents the distance (in-electrode protruding height of the fin S2) between an upper surface of the fin S2 and a bottom surface of the memory gate electrode MG on the insulating layer IS, and Wfin represents the width of the fin S2 in the x direction in which the first select gate structure 3, the memory gate structure 2, and the second select gate structure 4 extend over the fin S2, as illustrated in FIGS. 4A and 4B.

The memory cell MC is formed so that the relations of L1≤1.5·Wfin and L2≤1.5. Wfin hold with the width Wfin of the fin S2, where L1 and L2 represents the gate length of the first select gate electrode DG and the gate length of the second select gate electrode SG, respectively, in the y direction in which the fin S2 extends, as illustrated in FIG. 3A.

(3) Circuit Configuration of Nonvolatile Semiconductor Storage Device

Figure 5:
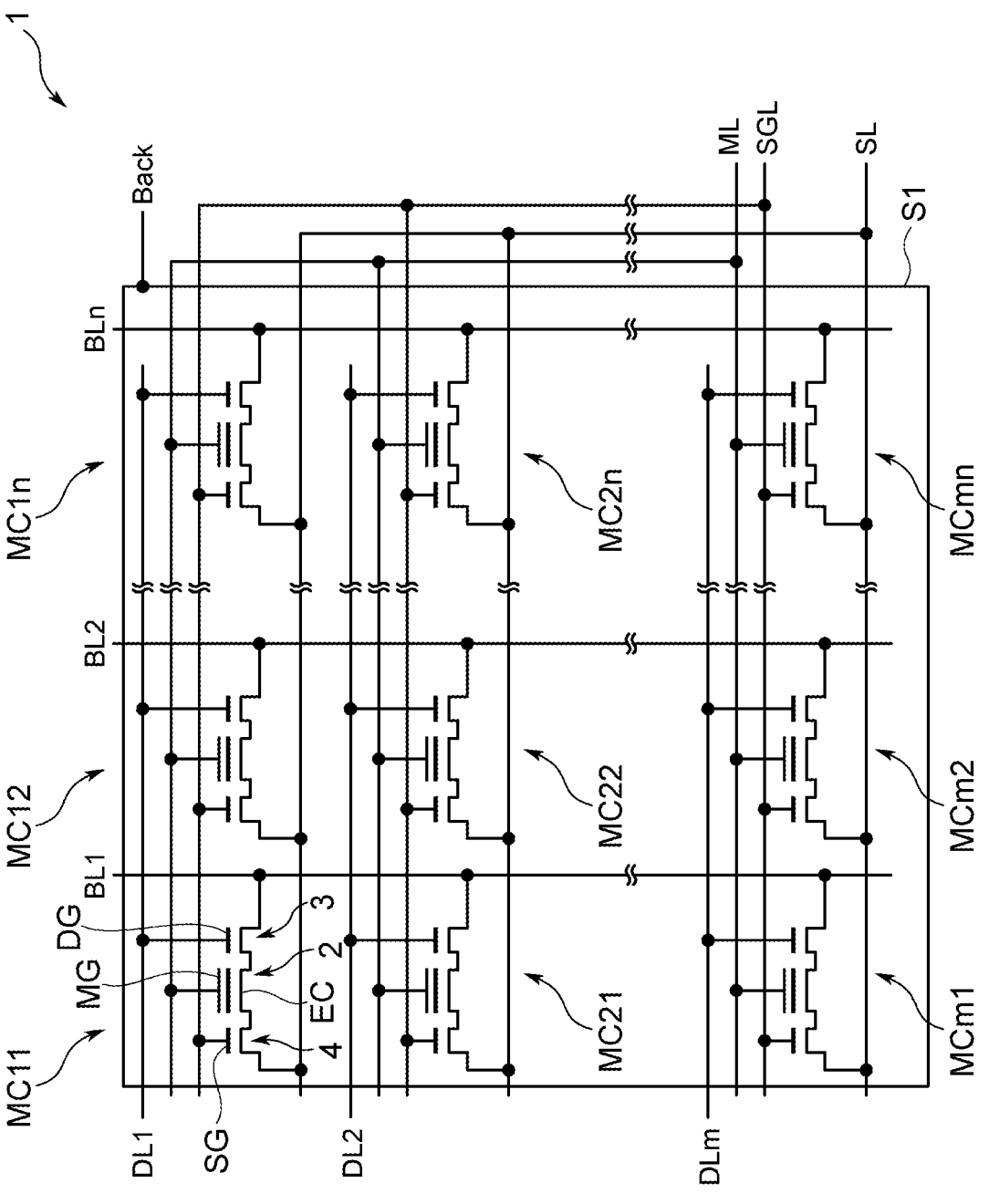
FIG. 5 is a schematic view illustrating a circuit configuration of a nonvolatile semiconductor storage device including a plurality of memory cells arranged in a matrix of rows and columns.

The following describes a circuit configuration of a non-volatile semiconductor storage device including the above-described memory cells MC arranged in a matrix of rows and columns. As illustrated in FIG. 5, the nonvolatile semiconductor storage device 1 includes a plurality of memory cells MC11, MC12, . . . , MC1n, MC21, MC22, . . . , MC2n, MCm1, MCm2, . . . , MCmn having configurations identical to those of the above-described memory cells MC and arranged in a matrix of rows and columns on the same semiconductor substrate S1. Predetermined substrate voltage is uniformly applied to the shared semiconductor substrate S1 of the memory cells MC11, MC12, . . . , MC1n, MC21, MC22, . . . , MC2n, MCm1, MCm2, . . . , MCmn by a substrate voltage application circuit (not illustrated). Although the semiconductor substrate S1 is integrated with the fin S2 as illustrated in FIG. 1, FIG. 5 omits illustration of the fin S2.

In the nonvolatile semiconductor storage device 1, a single bit line BL1 (BL2) (BLn) is shared by the memory cells MC11, MC21, . . . , MCm1 (MC12, MC22, . . . , MCm2) (MC1n, MC2n, . . . , MCmn) arranged in one direction (in this case, the column direction) among the memory cells MC11, MC12, . . . , MC1n, MC21, MC22, . . . , MC2n, MCm1, MCm2, . . . , MCmn. Predetermined bit voltage is uniformly applied to the bit lines BL1, BL2, . . . , BLn by a bit line voltage application circuit (not illustrated). In the nonvolatile semiconductor storage device 1, the single first select gate line DL1 (DL2) (DLm) is shared by the memory cells MC11, MC12, . . . , MC1n (MC21, MC22, . . . , MC2n) (MCm1, MCm2, . . . , MCmn) arranged in the other direction (in this case, the row direction) intersecting with the one direction. Predetermined first select gate voltage is uniformly applied to the first select gate lines DL1, DL2, . . . , DLm by a first select gate voltage application circuit (not illustrated).

In the nonvolatile semiconductor storage device 1 according to the present embodiment, the single memory gate line ML, the single second select gate line SGL, and a single source line SL are shared by all memory cells MC11, MC12, . . . , MC1n, MC21, MC22, . . . , MC2n, MCm1, MCm2, . . . , MCmn on the single semiconductor substrate S1. Predetermined memory gate voltage is applied to the memory gate line ML by the memory gate voltage application circuit (not illustrated), predetermined second select gate voltage is applied to the second select gate line SGL by the second select gate voltage application circuit (not illustrated), and predetermined source voltage is applied to the source line SL by a source line voltage application circuit (not illustrated).

In the present embodiment, next follows a description of the case in which the single memory gate line ML, the single second select gate line SGL, and the single source line SL are shared by all memory cells MC11, MC12, . . . , MC1n, MC21, MC22, . . . , MC2n, MCm1, MCm2, . . . , MCmn, but the present invention is not limited thereto. The memory gate line, the second select gate line, and the source line may be shared by the memory cells MC11, MC12, . . . , MC1n (MC21, MC22, . . . , MC2n) (MCm1, MCm2, . . . , MCmn) arranged in the other direction (row direction).

In the memory cell MC11, the memory gate electrode MG of the memory gate structure 2 is connected with the memory gate line ML, the first select gate electrode DG of the first select gate structure 3 is connected with the first select gate line DL1, and the second select gate electrode SG of the second select gate structure 4 is connected with the second select gate line SGL. In the memory cell MC11, one end (drain region) of the first select transistor T1 included in the first select gate structure 3 is connected with the bit line BL1, and one end (source region) of the second select transistor T2 included in the second select gate structure 4 is connected with the source line SL.

(4) Voltage at Various Operations in Nonvolatile Semiconductor Storage Device The following describes various operations in the nonvolatile semiconductor storage device 1 as described above. FIG. 6 illustrates a table listing an exemplary voltage value at each site at data programming operation ("Prog") in which charge is injected into the charge storage layer EC of a memory cell MCxy (x is 1, 2, . . . , m; y is 1, 2, . . . , n) in the nonvolatile semiconductor storage device 1 illustrated in FIG. 5, at data reading operation ("Read") in which whether charge is stored in the charge storage layer EC of the memory cell MCxy is detected, and at data erasing operation ("Erase") in which charge is removed from the charge storage layer EC of the memory cell MCxy.

In the column of "Prog" in FIG. 6, "select column" is a column including the memory cell MCxy into the charge storage layer EC of which charge is injected, and "select row" is a row including the memory cell MCxy into the charge storage layer EC of which charge is injected. In the column of "Prog" in FIG. 6, "non-select column" is a column including only the memory cell MCxy into the charge storage layer EC of which no charge is injected, and "non-select row" is a row including only the memory cell MCxy into the charge storage layer EC of which no charge is injected. In FIG. 6, "DLx" is the first select gate lines DL1, DL2, . . . , DLm, and "BLy" is the bit lines BL1, BL2, . . . , BLn.

(4-1) Data Programming Operation

For example, when charge is to be injected into the charge storage layer EC of the memory cell MC11, a charge storage gate voltage of 12 V is applied from the memory gate line ML to the memory gate electrode MG of the memory cell MC11, and a substrate voltage of 0 V is applied to the semiconductor substrate S1 ("Back" in FIG. 6) on which the fin S2 is disposed, as indicated in the column of "select column" of "Prog" in FIG. 6.

Simultaneously, a gate off voltage of 0 V is applied from the second select gate line SGL to the second select gate electrode SG of the memory cell MC11, and a source off voltage of 0 V is applied from the source line SL to the source region of the memory cell MC11. Accordingly, a source side non-conduction region is formed in the fin S2 in the second select gate structure 4 to block electrical connection between the source region and a channel layer formation carrier region (region in which carriers are induced when a channel layer is formed) inside the fin S2 surrounded by the memory gate structure 2. In this manner, the second select gate structure 4 prevents voltage application from the source line SL to the channel layer formation carrier region of the memory gate structure 2.

Simultaneously, a first select gate voltage of 1.5 V is applied from the first select gate line DL1 to the first select gate electrode DG, and a charge storage bit voltage of 0 V is applied from the bit line BL1 to the drain region of the memory cell MC11. Accordingly, a drain side conduction region is formed in the fin S2 in the first select gate structure 3 to achieve electrical connection between the drain region and the channel layer formation carrier region of the memory gate structure 2.

In the memory gate structure 2, the electrical connection between the channel layer formation carrier region and the drain region induces, in the channel layer formation carrier region, carriers that form a channel layer having a voltage of 0 V, which is equal to the charge storage bit voltage, on the surface of the fin S2. In this manner, in the memory cell (hereinafter also referred to as a selected program memory cell) MC11 to which data is programmed, charge is injected into the charge storage layer EC by a quantum tunneling effect caused by a large voltage difference of 12 V generated between the memory gate electrode MG and the channel layer in the memory gate structure 2, thereby achieving a data programmed state.

(4-2) No-Data Programming Operation

For example, to prevent charge injection into the charge storage layer EC of the memory cell MC12 when a charge storage gate voltage necessary for injecting charge into the charge storage layer EC is applied to the memory gate electrode MG of the memory cell MC12, a voltage of 1.5 V is applied from the first select gate line DL1 to the first select gate electrode DG, and a voltage of 1.5 V is applied from the bit line BL2 to the drain region. Accordingly, a drain side non-conduction region in a non-conductive state is formed in a region inside the fin S2 over which the first select gate structure 3 extends. In this manner, in the memory cell (hereinafter also referred to as a nonselected program memory cell) MC12 to which no data is to be programmed, the first select gate structure 3 blocks electrical connection between the drain region and the channel layer formation carrier region inside the fin S2 surrounded by the memory gate structure 2.

Simultaneously, in the nonselected program memory cell MC12, a voltage of 0 V is applied from the second select gate line SGL to the second select gate electrode SG, and a voltage of 0 V is applied from the source line SL to the source region, thereby forming a source side non-conduction region in a non-conductive state in a region inside the fin S2 over which the second select gate structure 4 extends. In this manner, in the nonselected program memory cell MC12, the second select gate structure 4 blocks electrical connection between the source region and the channel layer formation carrier region inside the fin S2 surrounded by the memory gate structure 2.

As a result, in the nonselected program memory cell MC12, a depleted layer is formed in the channel layer formation carrier region inside the fin S2 surrounded by the memory gate structure 2, so that potential at the surface of the fin S2 surrounded by the memory gate structure 2 increases in accordance with the charge storage gate voltage while reducing a voltage difference between the memory gate electrode MG and the surface of the fin S2.

In particular, in the present embodiment, since the in-electrode protruding height Hfin of the fin S2 and the width Wfin of the fin S2 have the relation of Hfin>Wfin in the memory cell MC as illustrated in FIGS. 4A and 4B, depleted layers are formed along both side surfaces and the upper surface inside the fin S2 surrounded by the memory gate structure 2. In this case, a depleted layer formed along one of the side surfaces inside the fin S2 and having a predetermined thickness is integrated with a depleted layer formed along the other side surface facing to the one side surface and having a predetermined thickness, thereby forming depleted layers entirely inside the fin S2. Accordingly, in the nonselected program memory cell MC12, the depleted layers prevent generation of a voltage difference enough to cause the quantum tunneling effect between the memory gate electrode MG and the fin S2, thereby preventing charge injection into the charge storage layer EC.

Simultaneously, in the nonselected program memory cell MC12, a depleted layer D formed in the fin S2 surrounded by the memory gate structure 2 prevents potential at the surface of the fin S2 directly below the memory gate structure 2 from reaching at the first select gate insulating films 17a and 18a (FIG. 3A) of the first select gate structure 3 and the second select gate insulating films 17b and 18b (FIG. 3A) of the second select gate structure 4.

Thus, in the first select gate structure 3, when the first select gate insulating films 17a and 18a have small thicknesses in accordance with a low bit voltage applied from the bit line BL2 to the drain region 12a (FIG. 3A), dielectric breakdown is prevented from occurring to the first select gate insulating films 17a and 18a due to the potential at the surface of the fin S2 directly below the memory gate structure 2 since the depleted layer blocks the potential at the surface of the fin S2.

Similarly, in the second select gate structure 4, when the second select gate insulating films 17b and 18b are formed to have small thicknesses in accordance with a low source voltage applied from the source line SL to the source region 12b (FIG. 3A), dielectric breakdown is prevented from occurring to the second select gate insulating films 17b and 18b due to the potential at the surface of the fin S2 directly below the memory gate structure 2 since the depleted layer blocks the potential at the surface of the fin S2.

(4-3) Data Reading Operation

In data reading operation as indicated in the column of "Read" in FIG. 6, for example, when data is to be read from the memory cell MC11, the bit line BL1 connected with the memory cell MC11 is precharged to, for example, 1.5 V, and the source line SL thereof is set to 0 V. With the configuration, when charge is stored in the charge storage layer EC of the memory cell MC11 from which data is to be read (when data is programmed), the fin S2 directly below the memory gate structure 2 is in a non-conductive state, thereby blocking electrical connection between the drain region and the source region. Accordingly, a reading voltage of 1.5 V applied to the bit line BL1 connected with the drain region is maintained intact in the memory cell MC11 from which data is to be read.

When no charge is stored in the charge storage layer EC of the memory cell MC11 from which data is to be read (when no data is programmed), the fin S2 directly below the memory gate structure 2 is in a conductive state, thereby achieving electrical connection between the drain region and the source region so that the source line SL at 0 V and the bit line BL1 at 1.5 V are electrically connected with each other through the memory cell MC11. Accordingly, in the nonvolatile semiconductor storage device 1, the reading voltage applied to the bit line BL1 connected with the memory cell MC11 from which data is to be read is applied to the source line SL at 0 V so that the reading voltage of 1.5 V applied to the bit line BL1 decreases.

In this manner, data reading operation to determine whether charge is stored in the charge storage layer EC of the memory cell MC11 can be executed in the nonvolatile semiconductor storage device 1 by detecting whether the reading voltage applied to the bit line BL1 has changed. Simultaneously, a non-reading voltage of 0 V is applied to the bit line BL2 only connected with the memory cells MC12, MC22, . . . , MCm2 from which no data is to be read.

(4-4) Data Erasing Operation

At data erasing operation ("Erase" in FIG. 6) in which charge is removed from the charge storage layer EC of the memory cell MC11, a memory gate voltage of −12 V is applied from the memory gate line ML to the memory gate electrode MG so that charge is removed from the charge storage layer EC toward the fin S2 at 0 V through the semiconductor substrate S1, thereby erasing data.

Figure 7:
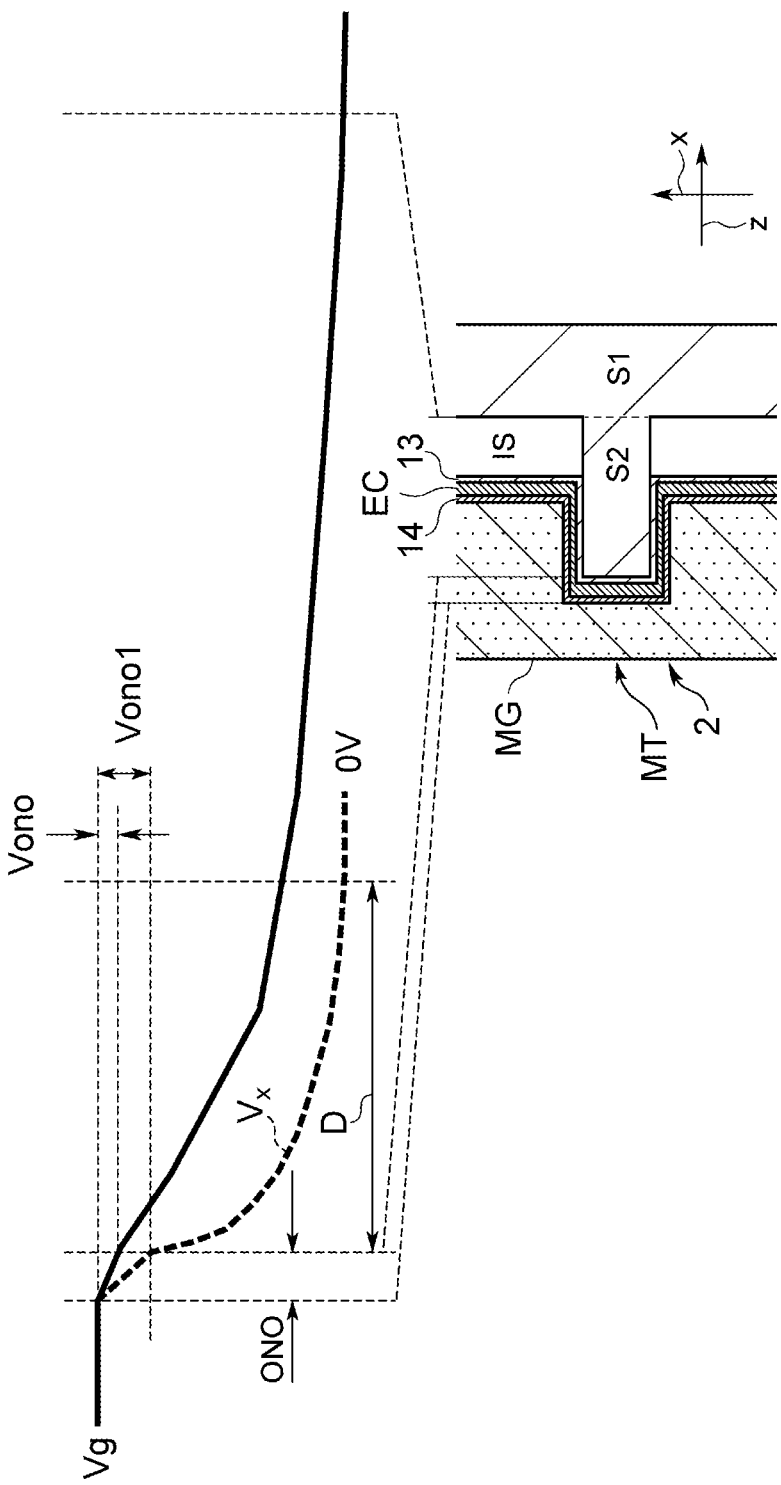
FIG. 7 is a schematic diagram for description of potential in a nonselected program memory cell.

(5) Potential at Nonselected Program Memory Cell to Memory Gate Electrode of which High Charge Storage Gate Voltage is Applied FIG. 7 is a schematic diagram illustrating potential at the memory gate structure 2 and the fin S2 when a high charge storage gate voltage Vg is applied to the memory gate electrode MG of the memory cell (nonselected program memory cell) MC to which no data is to be programmed. A cross-sectional view illustrated in FIG. 7 is same as FIG. 4A illustrating a sectional configuration taken along line C-C' in FIGS. 1 and 2, and illustrates a sectional configuration at a position on the fin S2 at which the memory gate structure 2 is provided.

In FIG. 7, curve Vx indicates potential at a memory cell (comparative example) in which a memory cell structure, a first select gate structure, and a second select gate structure are provided on a flat surface of a semiconductor substrate without no fin. In the memory cell according to the comparative example, when a high charge storage gate voltage is applied to the memory gate electrode MG, the depleted layer D can be formed in the semiconductor substrate directly below the memory gate structure by setting the semiconductor substrate directly below the first select gate structure and the semiconductor substrate directly below the second select gate structure to be non-conductive states as described above. Accordingly, a potential difference Vono1 generated between the memory gate electrode and the semiconductor substrate can be reduced to prevent data programming.

In such a memory cell according to the comparative example, voltage decreases through a three-layer component ONO of an upper memory gate insulating film, a charge storage layer, and a lower memory gate insulating film included in the memory gate structure, and further decreases through the depleted layer D with distance from the surface of the substrate, thereby finally reaching at a substrate voltage of 0 V. However, since no fin S2 is provided in the memory cell according to the comparative example, voltage applied to the three-layer component ONO of the upper memory gate insulating film, the charge storage layer, and the lower memory gate insulating film, and the potential change through the depleted layer D depend on impurity concentration inside the semiconductor substrate directly below the memory gate structure.

In other words, in the memory cell according to the comparative example, the depleted layer D when the high charge storage gate voltage Vg is applied to the memory gate electrode MG can be formed deeper by reducing the impurity concentration in the semiconductor substrate directly below the memory gate structure. Thus, in the memory cell according to the comparative example, potential more gradually changes through the three-layer component ONO of the upper memory gate insulating film, the charge storage layer, and the lower memory gate insulating film as the depleted layer D is deeper. Accordingly, a potential difference between the memory gate electrode and the surface of the semiconductor substrate is reduced to suppress the occurrence of disturbance.

However, as the impurity concentration inside the semiconductor substrate directly below the memory gate structure is reduced in the memory cell according to the comparative example, short circuit and leakage potentially occur between a drain region adjacent to the first select gate structure on the surface of the semiconductor substrate and a source region adjacent to the second select gate structure on the surface of the semiconductor substrate by a short channel effect. Thus, the distance between the drain region and the source region needs to be increased, which prevents refinement by scaling.

As described above, in the memory cell according to the comparative example, in which the memory cell structure, the first select gate structure, and the second select gate structure are provided on the flat surface of the semiconductor substrate, a trade-off relation holds between suppression of disturbance by reducing the impurity concentration inside the semiconductor substrate directly below the memory gate structure, and downsizing by reducing the distance between the drain region and the source region.

For example, in the memory cell according to the comparative example, the distance between the drain region and the source region is designed to be equal to the distance between the drain region 12a and the source region 12b in the memory cell MC. In this case, as illustrated in FIG. 7, the high charge storage gate voltage Vg applied to the memory gate electrode MG decreases through the three-layer component ONO of the upper memory gate insulating film, the charge storage layer, and the lower memory gate insulating film, but the impurity concentration inside the semiconductor substrate cannot be reduced to a predetermined value or lower since the distance between the drain region and the source region is defined. Thus, it is difficult to set the potential difference Vono1 between the memory gate electrode and the semiconductor substrate to a predetermined value or lower. For this reason, when the memory cell according to the comparative example is downsized by reducing the distance between the drain region and the source region, the occurrence of disturbance cannot be suppressed due to the large potential difference Vono1 generated between the memory gate electrode and the semiconductor substrate.

However, as illustrated in FIG. 7, when the charge storage gate voltage Vg (for example, Vg=12 V) is applied to the memory gate electrode MG of the memory cell MC to which no data is to be programmed, the voltage decreases through the three-layer component ONO of the upper memory gate insulating film 14, the charge storage layer EC, and the lower memory gate insulating film 13 so that a potential difference Vono is generated between the memory gate electrode MG and the upper surface of the fin S2. Simultaneously, a depleted layer is formed entirely inside the fin S2 surrounded by the memory gate structure 2, and thus the voltage gradually decreases through the depleted layer, reaching at a substrate voltage of 0 V near a lower end surface of the fin S2.

In the memory cell MC to which no data is to be programmed, the potential difference Vono through the three-layer component ONO of the upper memory gate insulating film 14, the charge storage layer EC, and the lower memory gate insulating film 13, and the potential change through the depleted layer can be controlled through the height (distance between the upper surface and the lower end surface of the fin S2) of the fin S2 and the width (distance between both side surfaces of the fin S2 facing to each other in the x direction in which the memory gate structure 2 extends over the fin S2) of the fin S2 in a region surrounded by the memory gate structure 2.

Specifically, the height and width of the fin S2 are set so that, when depleted layers are formed along both side surfaces and the upper surface inside the fin S2 surrounded by the memory gate structure 2, the depleted layer formed along one of the side surfaces inside the fin S2 and having a predetermined thickness is integrated with the depleted layer formed along the other side surface facing to the one side surface and having a predetermined thickness, thereby forming depleted layers entirely inside the fin S2.

Accordingly, when the memory cell MC is downsized by reducing the distance between the drain region 12a and source region 12b with a high impurity concentration inside the fin S2, the potential difference Vono generated between the memory gate electrode MG and the fin S2 can be reduced through depleted layers formed entirely inside the fin S2. In this manner, the memory cell MC can be downsized by reducing the distance between the drain region 12a and the source region 12b while the occurrence of disturbance is suppressed by reducing the potential difference Vono generated between the memory gate electrode MG and the fin S2 and also by reducing electric field applied to the depleted layers.

(6) Method for Manufacturing a Nonvolatile Semiconductor Storage Device

The nonvolatile semiconductor storage device 1 having the above-described configuration can be manufactured in accordance with the following manufacturing process. In this process, first, as illustrated in FIG. 8A, the fins S2 are formed at predetermined intervals on the surface of the plate-shaped semiconductor substrate S1 by fabricating a fin formation substrate (not illustrated) made of, for example, S1 by using a patterned hard mask 32a. Then, an insulating layer made of an insulative material is formed to cover the hard mask 32a, the semiconductor substrate S1, and the fin S2. The insulating layer is flattened through the flattening processing such as chemical mechanical polishing (CMP) to obtain an insulating layer ISa having a surface aligned of the hard mask 32a on the upper surface of the fin S2.

Figure 9B:
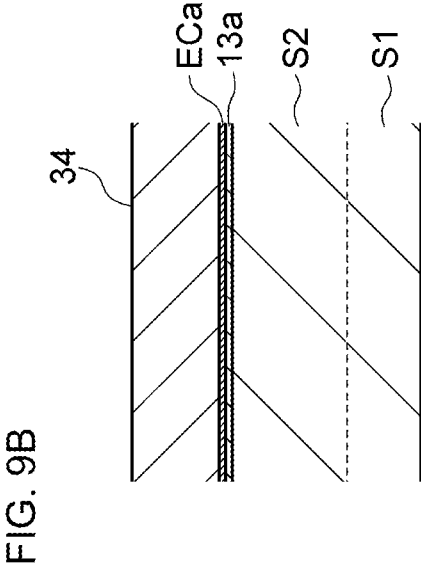
FIG. 9B is a schematic view illustrating a sectional configuration taken along line E-E' in FIG. 9A.
Figure 9D:
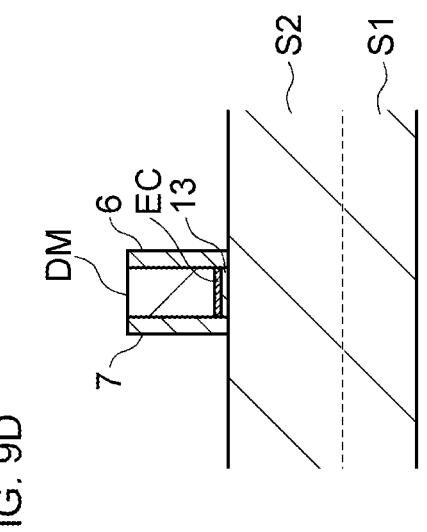
FIG. 9D is a schematic view illustrating a sectional configuration taken along line E-E' in FIG. 9C.
Figure 9A:
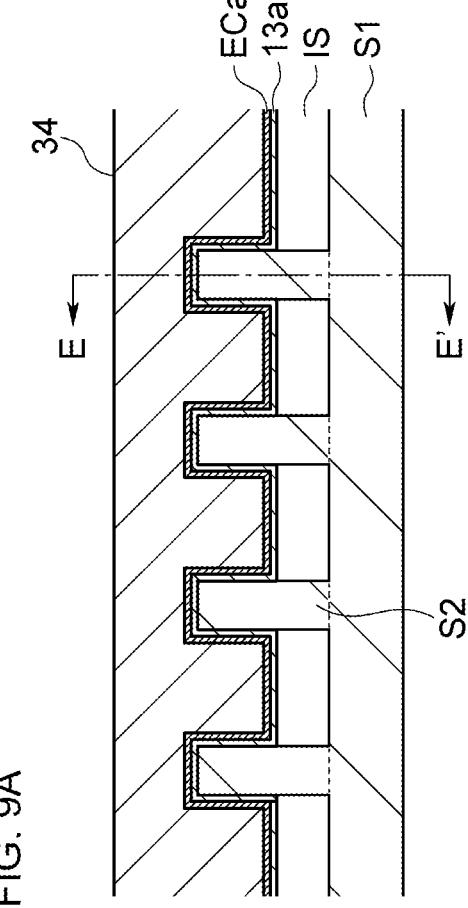
FIG. 9A is a schematic view illustrating manufacturing process (2) for the nonvolatile semiconductor storage device.

Then, the insulating layer ISa is fabricated to form the insulating layer IS from a surface of which the fin S2 protrudes to a certain height as illustrated in FIG. 9A. Thereafter, a layered lower memory gate insulating film formation layer 13a, a layered charge storage layer formation layer ECa, and a layered first dummy electrode layer 34 are formed as illustrated in FIG. 9A and FIG. 9B of a sectional configuration taken along line E-E' in FIG. 9A, and then the surface of the first dummy electrode layer 34 is flattened through the flattening processing such as CMP.

Figure 9C:
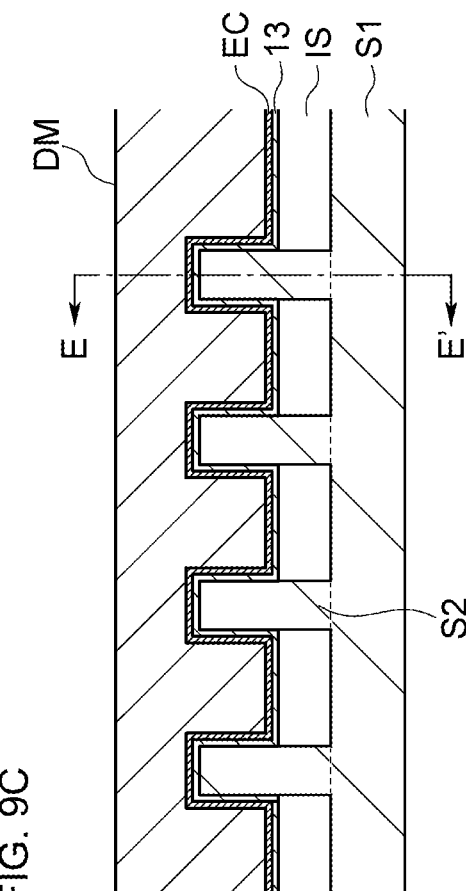
FIG. 9C is a schematic view illustrating manufacturing process (3) for the nonvolatile semiconductor storage device.

Then, the first dummy electrode layer 34, the charge storage layer formation layer ECa, and the lower memory gate insulating film formation layer 13a are fabricated to form a dummy memory gate electrode DM, the charge storage layer EC, and the lower memory gate insulating film 13 extending over the fin S2 as illustrated in FIG. 9C and FIG. 9D of a sectional configuration taken along line E-E' in FIG. 9C. Thereafter, a layered insulating film is formed and etched back to form the sidewall spacers 6 and 7 sidewall-shaped along sidewalls on which the dummy memory gate electrode DM, the charge storage layer EC, and the lower memory gate insulating film 13 are stacked (sidewall spacer formation process).

Figure 10A:
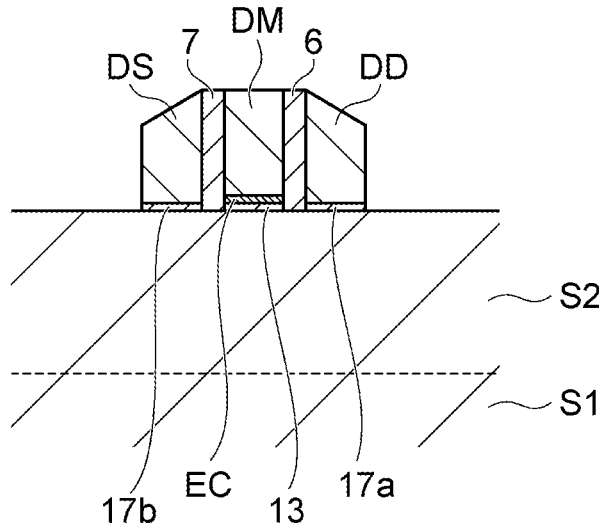
FIG. 10A is a schematic view illustrating manufacturing process (1) for the nonvolatile semiconductor storage device at the position illustrated in FIG. 9D.

Then, a layered select gate insulating film and a layered second dummy electrode layer are sequentially formed to cover the insulating layer IS, the fin S2, the dummy memory gate electrode DM, and the sidewall spacers 6 and 7 being externally exposed, and then etched back to form a dummy first select gate electrode DD and a dummy second select gate electrode DS sidewall-shaped along the sidewall spacers 6 and 7 as illustrated in FIG. 10A, in which any corresponding part to that in FIG. 9D is denoted by an identical reference sign. Then, the select gate insulating film in a region other than regions covered by the dummy first select gate electrode DD and the dummy second select gate electrode DS is removed so that the select gate insulating film remains in regions below the dummy first select gate electrode DD and the dummy second select gate electrode DS to form the first select gate insulating film 17a and the second select gate insulating film 17b.

Then, a layered insulating film is formed to cover the insulating layer IS, the fin S2, the dummy memory gate electrode DM, the dummy first select gate electrode DD, and the dummy second select gate electrode DS being externally exposed. The layered insulating film is then etched back to form, as illustrated in FIG. 10B, in which any corresponding part to that in FIG. 10A is denoted by an identical reference sign, the sidewall part 22a along sidewalls of the dummy first select gate electrode DD and the first select gate insulating film 17a on one side, and the sidewall part 22b along sidewalls of the dummy second select gate electrode DS and the second select gate insulating film 17b on the other side (dummy select gate electrode formation process).

Then, the drain region 12a and the source region 12b each made of, for example, SiGe and having a predetermined thickness are formed on the surfaces of the fin S2 adjacent to the sidewall parts 22a and 22b by, for example, epitaxy. Then, a layered interlayer insulating layer is formed to cover the insulating layer IS, the fin S2, the dummy memory gate electrode DM, the dummy first select gate electrode DD, the dummy second select gate electrode DS, the drain region 12a, the source region 12b, and the like being externally exposed. Thereafter, the surface of the interlayer insulating layer is polished and flattened through the flattening processing such as CMP.

Figure 10B:
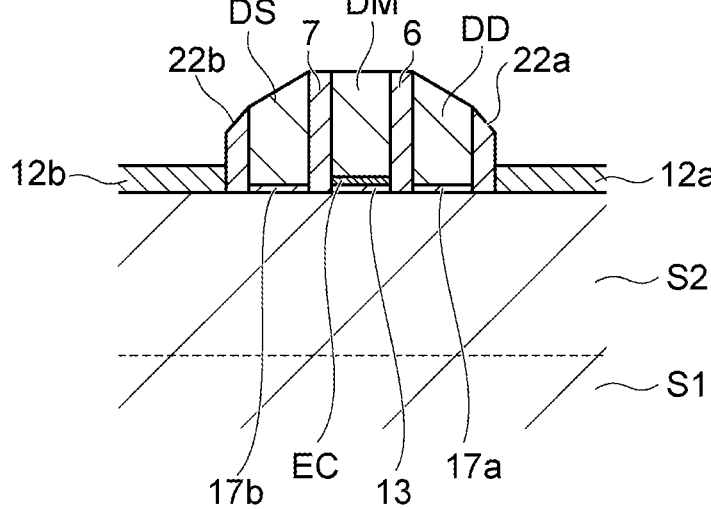
FIG. 10B is a schematic view illustrating manufacturing process (2) for the nonvolatile semiconductor storage device at the position illustrated in FIG. 9D.
Figure 10C:
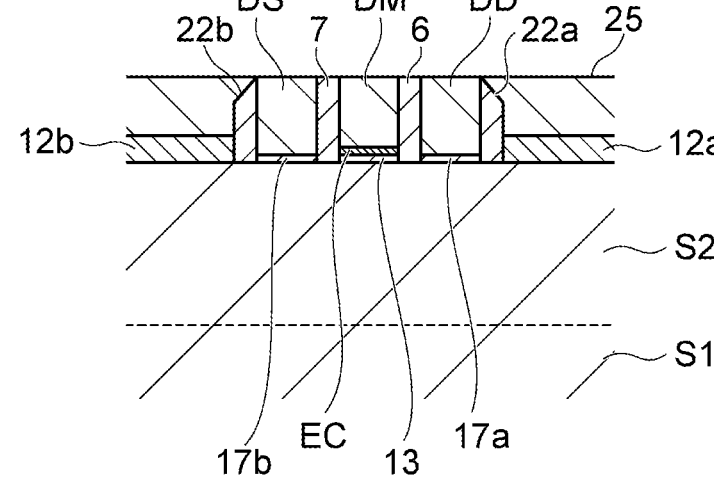
FIG. 10C is a schematic view illustrating manufacturing process (3) for the nonvolatile semiconductor storage device at the position illustrated in FIG. 9D.

This process forms the interlayer insulating layer 25 having a flattened surface on which upper surfaces of the dummy memory gate electrode DM, the dummy first select gate electrode DD, and the dummy second select gate electrode DS are externally exposed, as illustrated in FIG. 10C, in which any corresponding part to that in FIG. 10B is denoted by an identical reference sign (dummy electrode exposure process). Then, dry etching is performed to remove the dummy memory gate electrode DM, the dummy first select gate electrode DD, and the dummy second select gate electrode DS being exposed on the surface of the interlayer insulating layer 25.

Figure 11B:
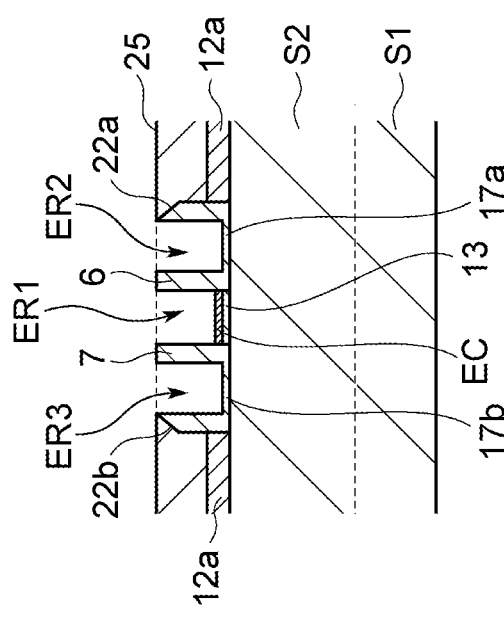
FIG. 11B is a schematic view illustrating a sectional configuration taken along line E-E' in FIG. 11A.
Figure 11A:
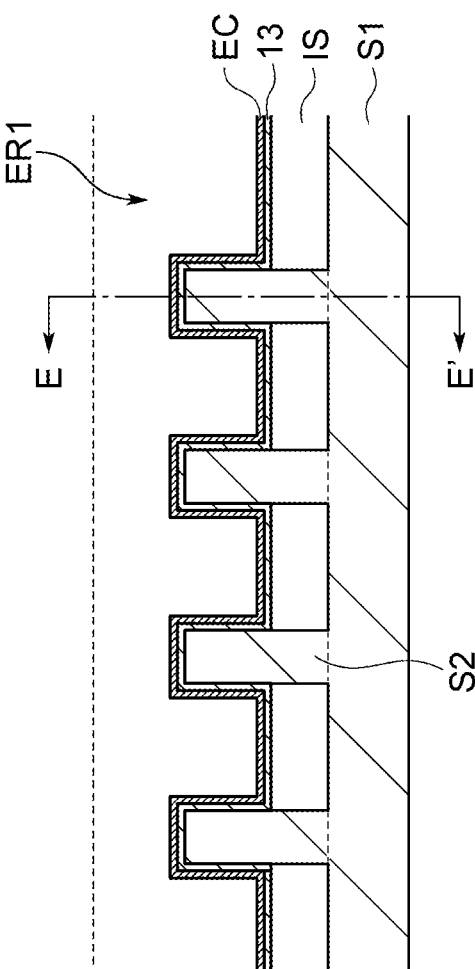
FIG. 11A is a schematic view illustrating manufacturing process (4) for the nonvolatile semiconductor storage device.

Accordingly, a dummy electrode removed space ER1 is formed in a region in which the dummy memory gate electrode DM has been formed, as illustrated in FIG. 11A, in which any corresponding part to that in FIG. 9C is denoted by an identical reference sign, and dummy electrode removed spaces ER2 and ER3 are formed in regions in which the dummy first select gate electrode DD and the dummy second select gate electrode DS have been formed, as illustrated in FIG. 11B of a sectional configuration taken along line E-E' in FIG. 11A (dummy electrode removal process).

Then, a layered insulating film made of an insulative material such as a high-k material is formed in the dummy electrode removed spaces ER1, ER2, and ER3 to obtain the layered upper memory gate insulating film 14 on the charge storage layer EC in the dummy electrode removed space ER1, the memory gate sidewall insulating film 15a wall-shaped along the first sidewall spacer 6, and the memory gate sidewall insulating film 15b wall-shaped along the second sidewall spacer 7, as illustrated in 3A.

In the dummy electrode removed space ER2, the upper first select gate insulating film 18a is formed on the first select gate insulating film 17a on the fin S2, the wall-shaped sidewall-part sidewall insulating film 20a is formed along the sidewall part 22a, and the wall-shaped first select gate sidewall insulating film 19a is formed along the first sidewall spacer 6.

In the dummy electrode removed space ER3, the upper second select gate insulating film 18b is formed on the second select gate insulating film 17b on the fin S2, the wall-shaped sidewall-part sidewall insulating film 20b is formed along the sidewall part 22b, and the wall-shaped second select gate sidewall insulating film 19b is formed along the second sidewall spacer 7.

Then, a metal electrode layer made of a metallic material such as aluminum (Al), titanium aluminide (TiAl), tantalum carbide (TaC), or tantalum silicon nitride (TaSiN) is formed on the surface of the interlayer insulating layer 25. Accordingly, the metal electrode layer is embedded in the dummy electrode removed spaces ER1, ER2, and ER3 from which the dummy memory gate electrode DM, the dummy first select gate electrode DD, and the dummy second select gate electrode DS are removed and in which the layered insulating film is formed. Thereafter, the surface of the metal electrode layer is polished through the flattening processing such as CMP to flatten the surface of the metal electrode layer in accordance with the surface of the interlayer insulating layer 25.

In this manner, as illustrated in 3A, the memory gate electrode MG is formed as the metal electrode layer embedded in a space in which the dummy memory gate electrode DM has been formed, the first select gate electrode DG is formed as the metal electrode layer embedded in a space in which the dummy first select gate electrode DD has been formed, and the second select gate electrode SG is formed as the metal electrode layer embedded in a space in which the dummy second select gate electrode DS has been formed. In this manner, the memory cell MC including the memory gate structure 2, the first select gate structure 3, and the second select gate structure 4 is formed (metal gate electrode formation process). Then, the manufacturing of the nonvolatile semiconductor storage device 1 is completed through, for example, a process of forming an interlayer insulating layer above the interlayer insulating layer 25, and a process of forming various contacts such as the first select gate contact DGC, the second select gate contact SGC, and a memory gate contact MCG illustrated in FIG. 2 at predetermined places on the interlayer insulating layer 25 and an interlayer insulating layer thereabove.

(7) Operations and Effects

In the memory cell MC having the above-described configuration, the fin S2 protruding from the insulating layer IS is provided on the semiconductor substrate S1, and the memory gate structure 2, the first select gate structure 3, and the second select gate structure 4 are disposed over the fin S2 on the insulating layer IS. In the memory cell MC, the drain region 12a connected with a bit line BL is provided on the surface of the fin S2 adjacent to the first select gate structure 3 and insulated from the first select gate electrode DG, and the source region 12b connected with the source line SL is provided on the surface of the fin S2 adjacent to the second select gate structure 4 and insulated from the second select gate electrode SG. The first select gate structure 3, the memory gate structure 2, and the second select gate structure 4 are provided between the drain region 12a and the source region 12b.

In the memory cell MC having such a configuration, when data programming is prevented by preventing charge injection into the charge storage layer EC, the first select gate structure 3 blocks electrical connection between the bit line BL and the inside of the fin S2 surrounded by the memory gate structure 2, and the second select gate structure 4 blocks electrical connection between the source line SL and the inside of the fin S2 surrounded by the memory gate structure 2. Accordingly, depleted layers formed along the surface of the fin S2 surrounded by the memory gate structure 2 are integrated with each other to form a depleted layer entirely inside the fin S2. The depleted layer leads to reduction of the potential difference between the memory gate electrode DG and the fin S2.

Thus, when the memory cell MC is downsized by reducing the distance between the drain region 12a and the source region 12b on the surface of the fin S2 with a high impurity concentration inside the fin S2, the potential difference between the memory gate electrode DG and the fin S2 can be reduced by setting the shape (height and width) of the fin S2 so that a depleted layer is formed entirely inside the fin S2, and the occurrence of disturbance can be suppressed by reducing electric field applied to the depleted layer. Accordingly, the memory cell MC achieves downsizing and suppression of the occurrence of disturbance.

The gate widths of the memory gate structure 2, the first select gate structure 3, and the second select gate structure 4 extend in C shapes along both side surfaces and the surface of the fin S2 such that the height of the fin S2 serves as part of the gate widths. The configuration leads to height increase by the height of the fin S2 but also leads to reduction of the formation area of each gate width in the x direction in which the memory gate structure 2, the first select gate structure 3, and the second select gate structure 4 extend over the fin S2, thereby achieving downsizing accordingly.

When no data is to be programmed to the memory cell MC, voltage applied to the bit line BL and the source line SL is not restricted to a high charge storage gate voltage applied to the memory gate electrode MG but can be reduced to voltage for achieving a non-conductive state inside the fin S2 directly below the first select gate structure 3 and the second select gate structure 4. Thus, the thicknesses of the first select gate insulating films 17a and 18a of the first select gate structure 3 and the second select gate insulating films 17b and 18b of the second select gate structure 4 can be reduced in accordance with the voltage reduction at the bit line and the source line, thereby achieving downsizing accordingly.

In the nonvolatile semiconductor storage device 1 including the memory cells MC arranged in the matrix and sharing the memory gate line ML, the potential difference Vono between the memory gate electrode MG and the fin S2 is small and thus electric field applied to the depleted layer is small in the memory cell MC to which no data is to be programmed. Accordingly, the occurrence of disturbance can be suppressed in the memory cell MC to which no data is to be programmed, when a high charge storage gate voltage is repeatedly applied to the memory gate electrode MG through the memory gate line ML. Thus, in the nonvolatile semiconductor storage device 1, the occurrence of disturbance can be suppressed in the memory cells MC arranged in, for example, 128 rows or more and 1024 columns or more and sharing the memory gate line ML, and thus a significantly increased number of memory cells can be processed at once on a mat.

(8) Other Embodiments (8-1) Configuration of Memory Cell Including Memory Gate Electrode, First Select Gate Electrode, and Second Select Gate Electrode Made of Conductive Material Other than Metallic Material In the above-described embodiment, the memory gate electrode MG, the first select gate electrode DG, and the second select gate electrode SG are each made of a metallic material, but the present invention is not limited thereto. The memory gate electrode, the first select gate electrode, and the second select gate electrode may be made of any other conductive material such as polysilicon.

Figure 12B:
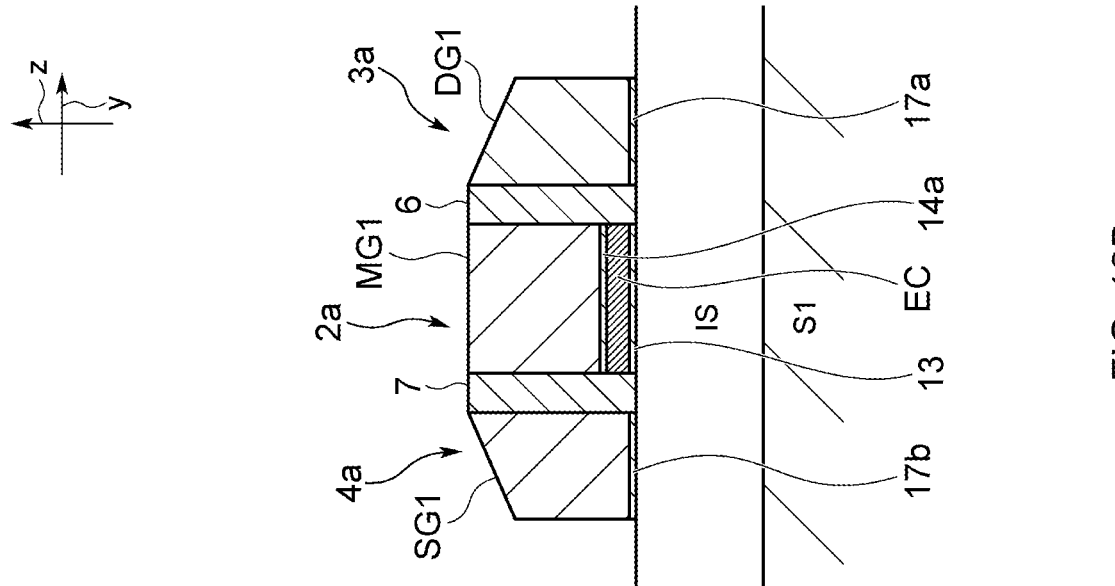
FIG. 12B is a schematic view illustrating a sectional configuration of the memory cell according to the other embodiment taken along line B-B' in FIG. 2.

The following describes an embodiment in which the memory gate electrode MG, the first select gate electrode DG, and the second select gate electrode SG are each made of a conductive material (for example, polysilicon) other than a metallic material. In this case, the nonvolatile semiconductor storage device has a planar layout same as that illustrated in FIG. 2, a sectional configuration taken along line A-A' in FIG. 2 as illustrated in FIG. 12A, and a sectional configuration taken along line B-B' in FIG. 2 as illustrated in FIG. 12B.

Figure 12A:
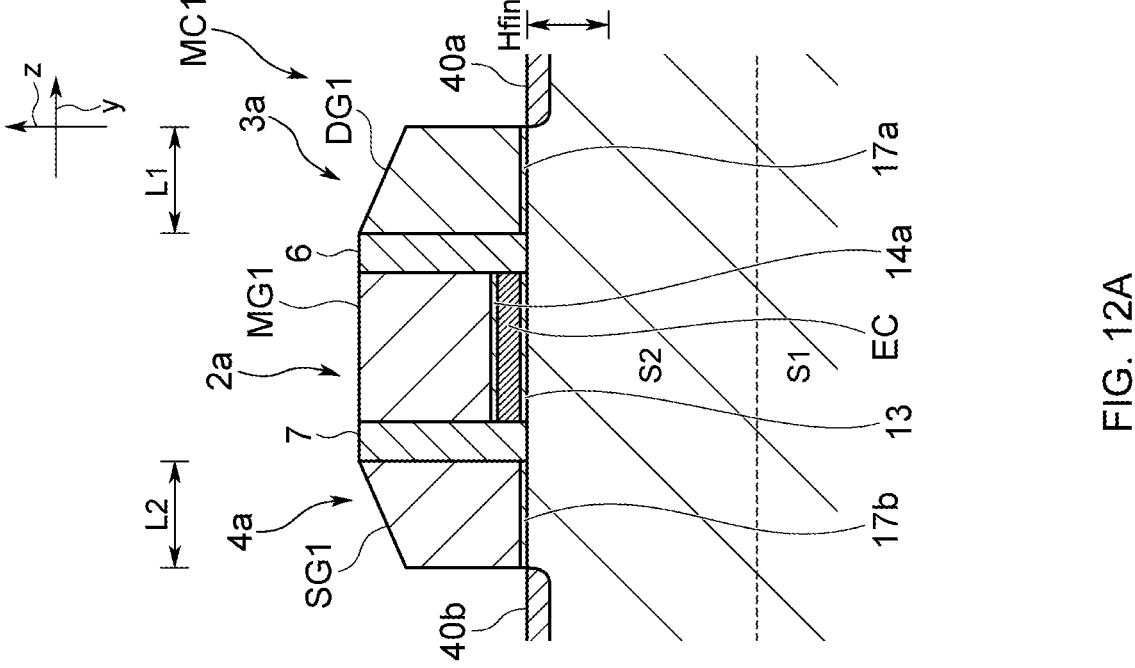
FIG. 12A is a schematic view illustrating a sectional configuration of a memory cell according to another embodiment taken along line A-A' in FIG. 2.

As illustrated in FIG. 12A, in which any corresponding part to that in FIG. 3A is denoted by an identical reference sign, impurity diffusion regions formed by impurity implantation are provided as a drain region 40a and a source region 40b at a predetermined interval therebetween on the surface of the fin S2 of a memory cell MC1. The drain region 40a is connected with a bit line (not illustrated), and the source region 40b is connected with a source line (not illustrated).

The memory cell MC1 includes a memory gate structure 2a including the lower memory gate insulating film 13, the charge storage layer EC, an upper memory gate insulating film 14a, and a memory gate electrode MG1 stacked in this order on the fin S2. The lower memory gate insulating film 13 and the upper memory gate insulating film 14a are made of an identical insulative material (for example, oxide silicon (SiO or $SiO_2$)), and the memory gate electrode MG1 is made of polysilicon.

A first select gate structure 3a is provided between the drain region 12a and the memory gate structure 2a and includes a first select gate electrode DG1 made of polysilicon and stacked on the first select gate insulating film 17a. The first select gate structure 3a is adjacent to the sidewall spacer 6 disposed on the first sidewall of the memory gate structure 2a, and has such a sidewall shape that a top portion of the first select gate electrode DG1 slopes down toward the fin S2 with the distance from the memory gate electrode MG1.

A second select gate structure 4a is provided between the source region 40b and the memory gate structure 2a and includes a second select gate electrode SG1 made of polysilicon and stacked on the second select gate insulating film 17b. The second select gate structure 4a is adjacent to the sidewall spacer 7 disposed on the second sidewall of the memory gate structure 2a, and has such a sidewall shape that a top portion of the second select gate electrode SG1 slopes down toward the fin S2 with the distance from the memory gate electrode MG1.

The memory gate structure 2a, the first select gate structure 3a, and the second select gate structure 4a extend over the fin S2. The memory gate structure 2a, the first select gate structure 3a, and the second select gate structure 4a, as illustrated in FIG. 12A, are provided on the insulating layer IS on which the fin S2 is not provided, as illustrated in FIG. 12B, in which any corresponding part to that in FIG. 3B is denoted by an identical reference sign.

In the memory cell MC1, for example, a layered electrode formation layer is etched back through the manufacturing process to form the first select gate electrode DG1 and the second select gate electrode SG1 sidewall-shaped along sidewalls of the memory gate structure 2a. Accordingly, the memory gate structure 2a, the first select gate structure 3a, the second select gate structure 4a, and the sidewall spacers 6 and 7 have identical thicknesses where the fin S2 is formed and where the fin S2 is not formed. Thus, the memory gate structure 2a, the first select gate structure 3a, the second select gate structure 4a, and the sidewall spacers 6 and 7 protrude by the height of the fin S2 where the fin S2 is formed as compared to where the fin S2 is not formed.

Similarly to the above-described embodiment, in the memory cell MC1, too, the relation of Hfin>Wfin holds between the distance (in-electrode protruding height of the fin S2) Hfin between the upper surface of the fin S2 and a bottom surface of the memory gate electrode MG1 on the insulating layer IS, and the width Wfin of the fin S2 (FIG. 4A and FIG. 4B) in the x direction in which the memory gate structure 2a, the first select gate structure 3a, and the second select gate structure 4a extend over the fin S2.

In the memory cell MC1, the relations of L1≤1.5·Wfin and L2≤1.5·Wfin hold between the gate length L1 of the first select gate electrode DG1, the gate length L2 of the second select gate electrode SG1, and the width Wfin of the fin S2 in the y direction in which the fin S2 extends. Data programming operation, no-data programming operation, data reading operation, and data erasing operation can be executed on the memory cell MC1 in accordance with, for example, the above description of "(4) Voltage at various operations in nonvolatile semiconductor storage device".

The memory cell MC1 having the above-described configuration can achieve effects same as those of the above-described embodiment such as downsizing and suppression of the occurrence of disturbance.

(8-2) Configuration of Memory Cell Including Cap Insulating Film on Upper Surface of Fin In the above-described embodiment, the memory cell MC includes the lower memory gate insulating film 13 on the upper surface of the fin S2, but the present invention is not limited thereto. A cap insulating film having a predetermined thickness may be provided on the upper surface of the fin S2, and the lower memory gate insulating film 13 may be provided on the cap insulating film.

Figure 13:
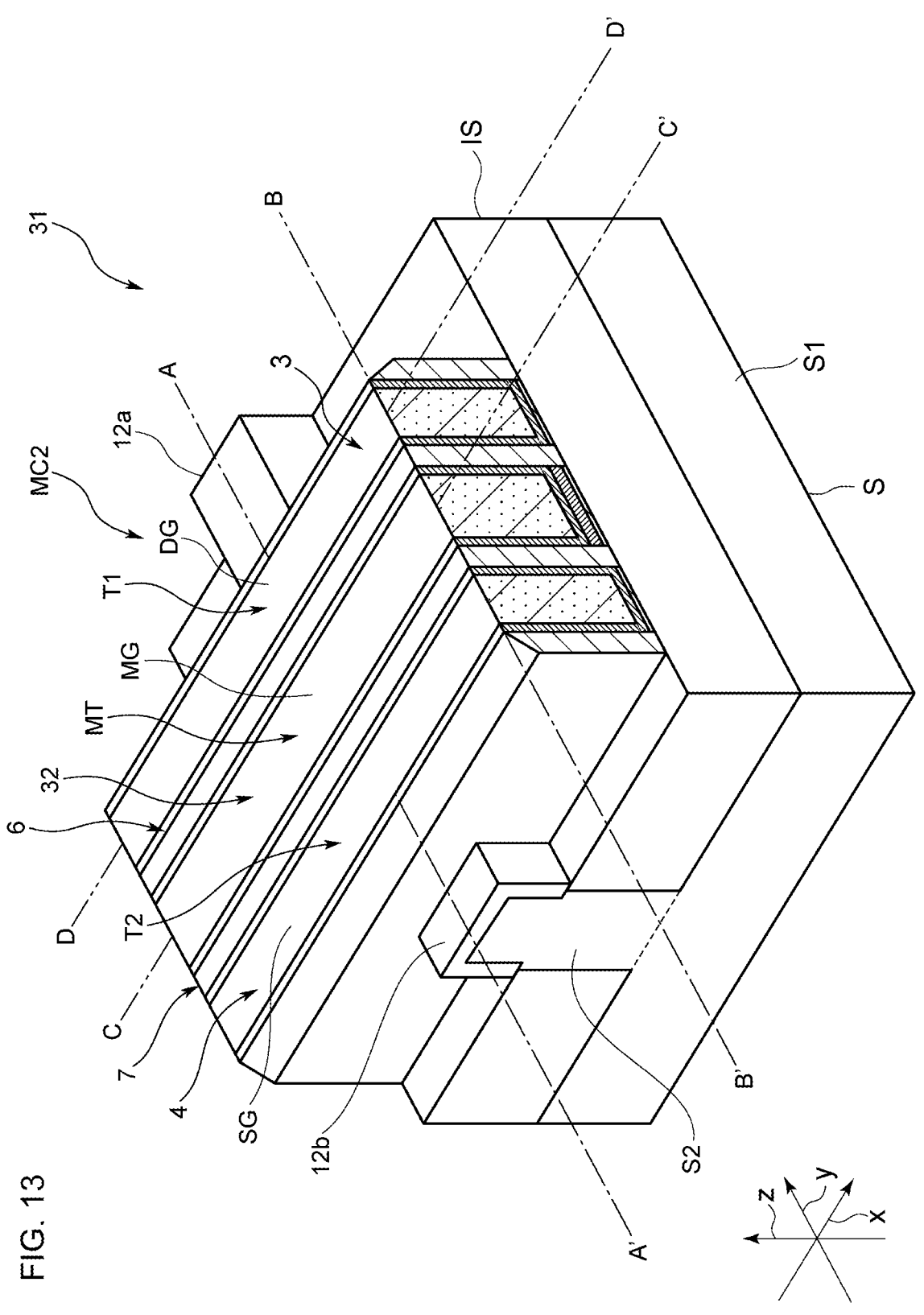
FIG. 13 is a perspective view illustrating configuration (2) of the memory cell.

FIG. 13 illustrates a nonvolatile semiconductor storage device 31 according to another embodiment. The nonvolatile semiconductor storage device 31 is provided with a memory cell MC2 including a memory gate structure 32 including a cap insulating film (not illustrated). The memory cell MC2 has an appearance identical to that of the memory cell MC illustrated in FIG. 2, but the cap insulating film is provided on the upper surface of the fin S2 covered by the memory gate structure 32.

Figures 14A, 14B:
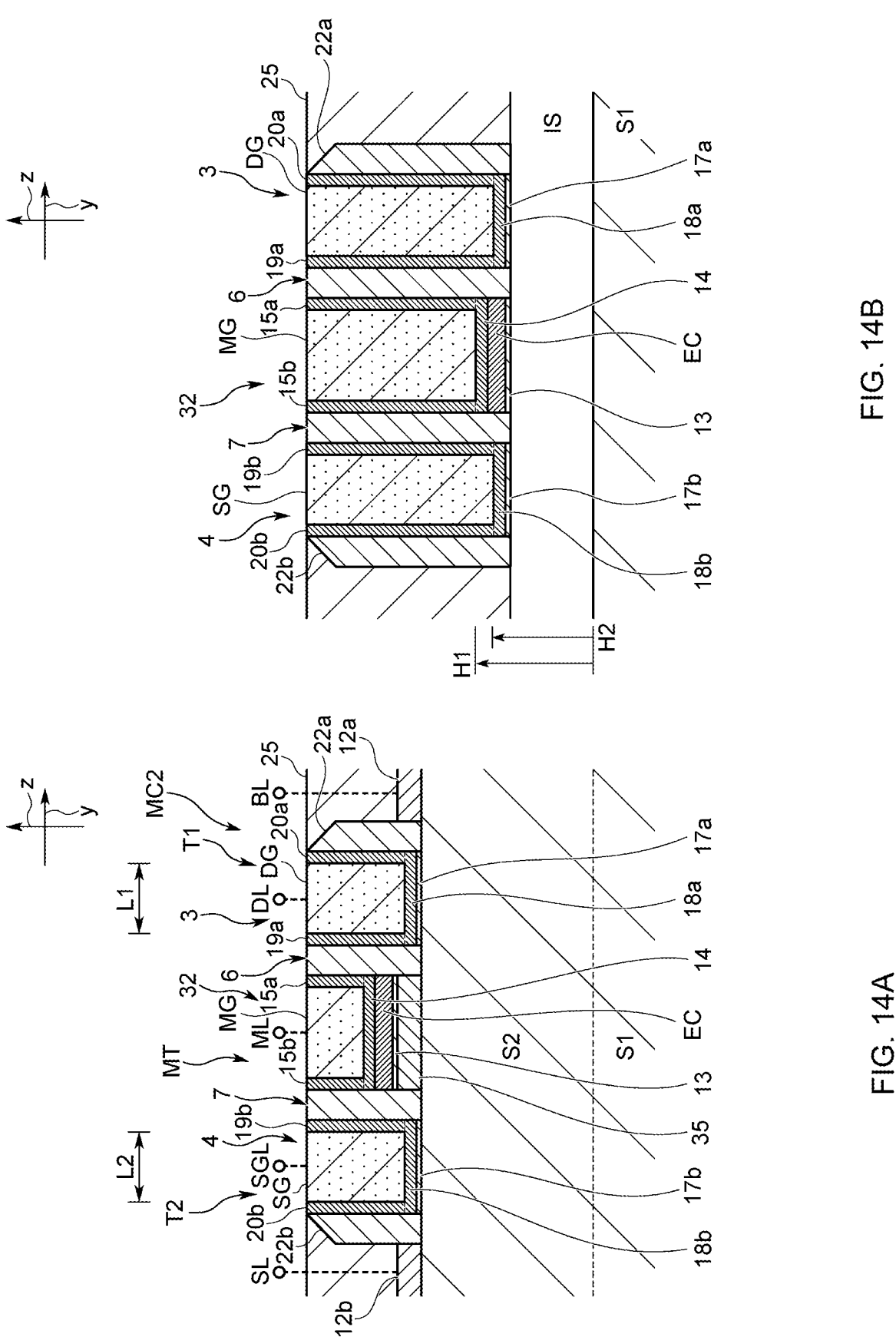
FIG. 14A is a schematic view illustrating a sectional configuration taken along line A-A' in FIG. 13.
FIG. 14B is a schematic view illustrating a sectional configuration taken along line B-B' in FIG. 13.
Figure 15B:
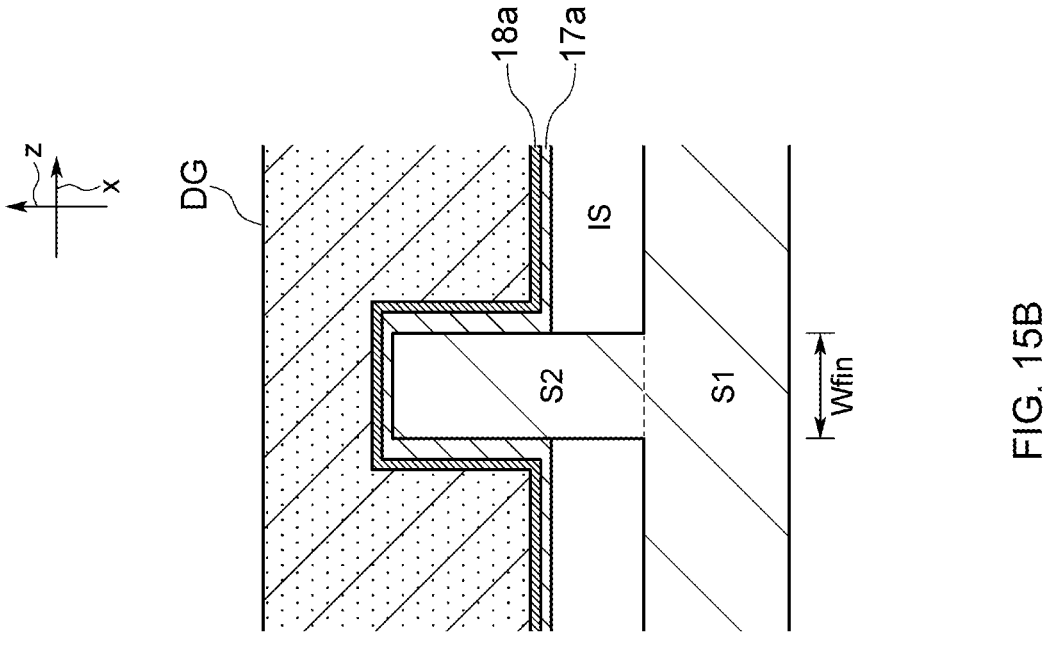
FIG. 15B is a schematic view illustrating a sectional configuration of the memory cell taken along line D-D' in FIG. 13.
Figure 15A:
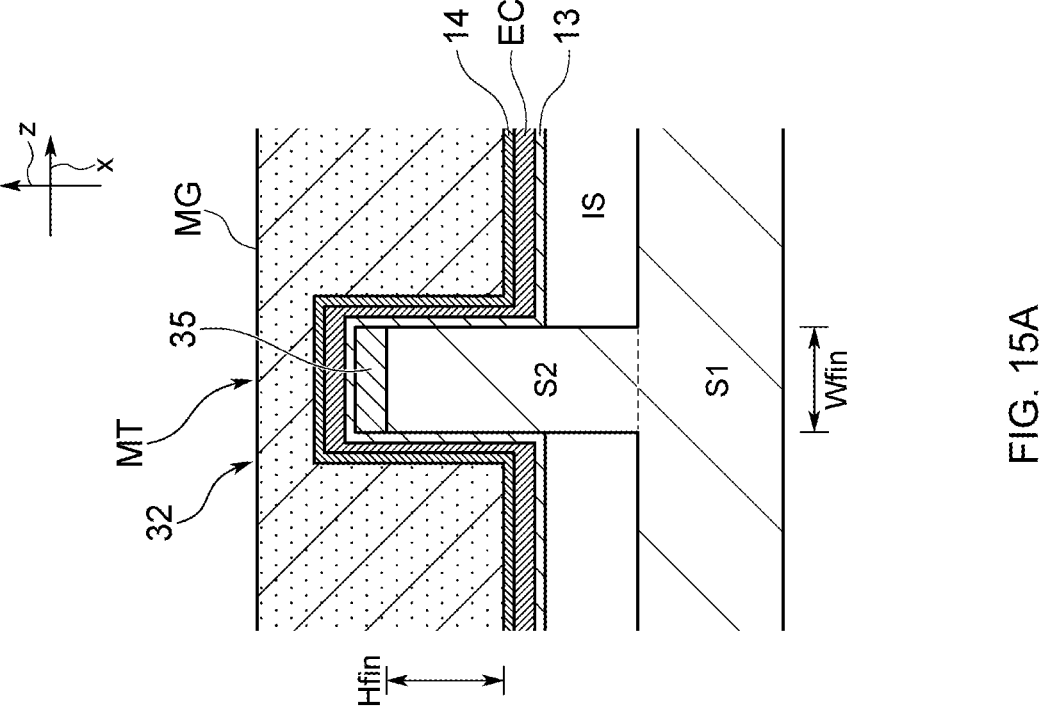
FIG. 15A is a schematic view illustrating a sectional configuration of the memory cell taken along line C-C' in FIG. 13.

FIG. 14A illustrates a sectional configuration taken along line A-A' in FIG. 13. FIG. 14B illustrates a sectional configuration taken along line B-B' in FIG. 13. FIG. 15A illustrates a sectional configuration taken along line C-C' in FIG. 13. FIG. 15B illustrates a sectional configuration taken along line D-D' in FIG. 13. As illustrated in FIGS. 14A and 15A, the memory gate structure 32 includes a cap insulating film 35 having a predetermined thickness on the upper surface of the fin S2. The lower memory gate insulating film 13, the charge storage layer EC, the upper memory gate insulating film 14, and the memory gate electrode MG are sequentially stacked on the cap insulating film 35.

In the present embodiment, the memory gate structure 32 includes the lower memory gate insulating film 13 on the cap insulating film 35, but the present invention is not limited thereto. For example, the cap insulating film 35 may be provided as the lower memory gate insulating film 13 so that the charge storage layer EC, the upper memory gate insulating film 14, and the memory gate electrode MG are sequentially stacked on the cap insulating film 35 serving as a lower memory gate insulating film.

As illustrated in FIG. 14B, the cap insulating film 35 is not disposed where the fin S2 is not formed in the memory gate structure 32, so that the lower memory gate insulating film 13 is disposed on the insulating layer IS. The charge storage layer EC, the upper memory gate insulating film 14, and the memory gate electrode MG are sequentially stacked on the lower memory gate insulating film 13. Thus, in the memory gate structure 32, the cap insulating film 35 is provided only in a region in which the upper surface of the fin S2 is disposed, and covers the upper surface of the fin S2.

The cap insulating film 35 is made of an insulative material such as oxide silicon (SiO, SiO₂, or SiN) and has a thickness of, for example, 4 nm or larger. The cap insulating film 35 may have a layered configuration made of a single insulative material, or a stacked configuration made of different kinds of insulative materials.

As illustrated in FIGS. 14A, 14B, and 15B, the first select gate structure 3 does not include the cap insulating film 35, and the first select gate insulating films 17a and 18a and the first select gate electrode DG are sequentially stacked on the fin S2 and the insulating layer IS. Similarly, the second select gate structure 4 does not include the cap insulating film 35, and the second select gate insulating films 17b and 18b and the second select gate electrode SG are sequentially stacked on the fin S2 and the insulating layer IS.

Figure 8:
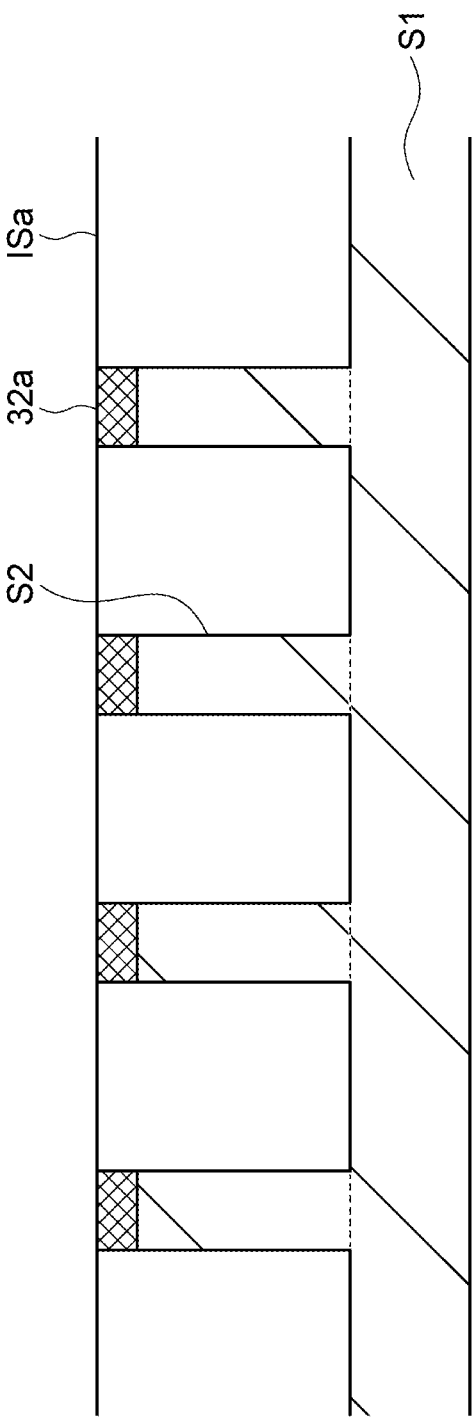
FIG. 8 is a schematic view illustrating manufacturing process (1) for the nonvolatile semiconductor storage device.

In a method for manufacturing the memory gate structure 32 including the cap insulating film 35, the hard mask 32a made of an insulative material is used to form the fin S2 by fabricating the plate-shaped fin formation substrate (not illustrated) as illustrated in FIG. 8, and left intact as the cap insulating film 35 through, for example, a fin formation process. Then, through a subsequent first dummy electrode layer formation process, the layered lower memory gate insulating film formation layer 13a, the layered charge storage layer formation layer ECa, and the layered first dummy electrode layer 34 (refer to FIGS. 9A and 9B) are stacked in this order on the insulating layer IS, and the cap insulating film 35 covering the upper surface of the fin S2.

When the lower memory gate insulating film formation layer 13a is formed by an oxidation method, the lower memory gate insulating film formation layer 13a is not formed on the cap insulating film 35 in some cases. In this case, in a memory gate structure finally formed, the cap insulating film 35 is provided as the lower memory gate insulating film 13, and the charge storage layer EC, the upper memory gate insulating film 14, and the memory gate electrode MG are sequentially stacked on the cap insulating film 35.

Through a subsequent dummy memory gate structure formation process, the lower memory gate insulating film formation layer 13a, the charge storage layer formation layer ECa, and the first dummy electrode layer 34 are patterned to form a dummy memory gate structure 32 over the fin S2, the upper surface of which is covered by the cap insulating film 35, on the insulating layer IS. Thereafter, for example, the sidewall spacer formation process, the dummy select gate electrode formation process, the dummy electrode exposure process, and the metal gate electrode formation process described above are performed to manufacture the memory cell MC2.

The memory cell MC2 having the above-described configuration can achieve effects same as those of the above-described embodiment. In addition, for example, the cap insulating film 35 provided to the memory gate structure 32 and covering the upper surface of the fin S2 can prevent concentration of electric field around sharp corners at intersections of the upper surface and side surfaces of the fin S2 at data programming operation. The configuration can prevent a programming defect that charge cannot be injected into the charge storage layer along a fin sidewall due to the concentration of electric field around the corners at programming.

In the above-described embodiment, the cap insulating film 35 covering the upper surface of the fin S2 is provided in the memory gate structure 32 of the memory cell MC2 including the memory gate electrode MG, the first select gate electrode DG, and the second select gate electrode SG made of a metallic material, but the present invention is not limited thereto. As illustrated in FIGS. 12A and 12B, the cap insulating film 35 covering the upper surface of the fin S2 may be provided in the memory gate structure 2a of the memory cell MC1 including the memory gate electrode MG1, the first select gate electrode DG1, and the second select gate electrode SG1 made of a conductive material such as polysilicon. In this case, too, the cap insulating film 35 can prevent concentration of electric field around the sharp corners at intersections of the upper surface and side surfaces of the fin S2 at data erasing operation in the memory cell MC1.

(8-3) Others

The present invention is not limited to the above-described embodiments, but may be modified in various kinds of ways without departing from the scope of the present invention. In each embodiment, for example, any various kinds of voltage values other than the voltage values described above in "(4) Voltage at various operations in nonvolatile semiconductor storage device" are applicable.

In the memory cell MC illustrated in FIGS. 3A and 3B, the first select gate insulating films 17a and 18a are in a two-layer structure, and the second select gate insulating films 17b and 18b are in a two-layer structure, but the present invention is not limited thereto. A one-layer structure including one of the first select gate insulating films 17a and 18a and a one-layer structure including one of the second select gate insulating films 17a and 18a are applicable.

In the above-described embodiments, the memory gate sidewall insulating films 15a and 15b are provided along the sidewalls of the memory gate electrode MG (FIGS. 3A and 3B), but the present invention is not limited thereto. Any one of the memory gate sidewall insulating films 15a and 15b may be provided along one of the sidewalls of the memory gate electrode, or none of the memory gate sidewall insulating films 15a and 15b may be provided to the memory gate electrode.

In the above-described embodiments, the first select gate sidewall insulating film 19a and the sidewall-part sidewall insulating film 20a are provided along the sidewalls of the first select gate electrode DG (FIGS. 3A and 3B), but the present invention is not limited thereto. Any one of the first select gate sidewall insulating film 19a and the sidewall-part sidewall insulating film 20a may be provided along one of the sidewalls of the first select gate electrode, or none of the first select gate sidewall insulating film 19a and the sidewall-part sidewall insulating film 20a may be provided to the first select gate electrode.

In the above-described embodiments, the second select gate sidewall insulating film 19b and the sidewall-part sidewall insulating film 20b are provided along the sidewalls of the second select gate electrode SG (FIGS. 3A and 3B), but the present invention is not limited thereto. Any one of the second select gate sidewall insulating film 19b and the sidewall-part sidewall insulating film 20b may be provided along one of the sidewalls of the second select gate electrode, or none of the second select gate sidewall insulating film 19b and the sidewall-part sidewall insulating film 20b may be provided to the second select gate electrode.

In the above-described embodiments, the upper memory gate insulating film 14, the memory gate sidewall insulating films 15a and 15b, the first select gate sidewall insulating film 19a, the sidewall-part sidewall insulating film 20a, the second select gate sidewall insulating film 19b, and the sidewall-part sidewall insulating film 20b are each made of an insulative material different from those of the sidewall spacers 6 and 7, but the present invention is not limited thereto. The upper memory gate insulating film 14, the memory gate sidewall insulating films 15a and 15b, the first select gate sidewall insulating film 19a, the sidewall-part sidewall insulating film 20a, the second select gate sidewall insulating film 19b, and the sidewall-part sidewall insulating film 20b may be each made of an insulative material same as those of the sidewall spacers 6 and 7. The memory cell may be provided on the semiconductor substrate S1 and the fin S2 in which N-type impurities are implanted.

In the above-described embodiments, the memory gate electrode MG, the first select gate electrode DG, and the second select gate electrode SG are formed from a one-layer metallic layer, but the present invention is not limited thereto. For example, the memory gate electrode MG, the first select gate electrode DG, and the second select gate electrode SG may be formed in a stacked structure obtained by sequentially stacking a plurality of kinds of metallic layers made of different kinds of metallic materials.

In the above-described embodiments, the drain region 12a and the source region 12b made of SiGe or the like and having predetermined thicknesses are formed by, for example, epitaxy, but the present invention is not limited thereto. The drain and source regions may be formed as impurity diffusion regions through impurity implantation in the surface of the fin S2.

In the above-described embodiments, in the dummy select gate electrode formation process of the manufacturing method, a select gate insulating film and a second dummy electrode layer covering a dummy memory gate structure are formed and then etched back to form the sidewall-shaped dummy first select gate electrode over the fin along the first sidewall spacer on a sidewall of the dummy memory gate structure and form the sidewall-shaped dummy second select gate electrode over the fin along the second sidewall spacer on the other sidewall of the dummy memory gate structure, and thereafter, the select gate insulating film is fabricated to form the first select gate insulating film below the dummy first select gate electrode and form the second select gate insulating film below the dummy second select gate electrode, but the present invention is not limited thereto. The dummy select gate electrode formation process may form the dummy first select gate electrode and the dummy second select gate electrode without forming the select gate insulating film.

Figure 16:
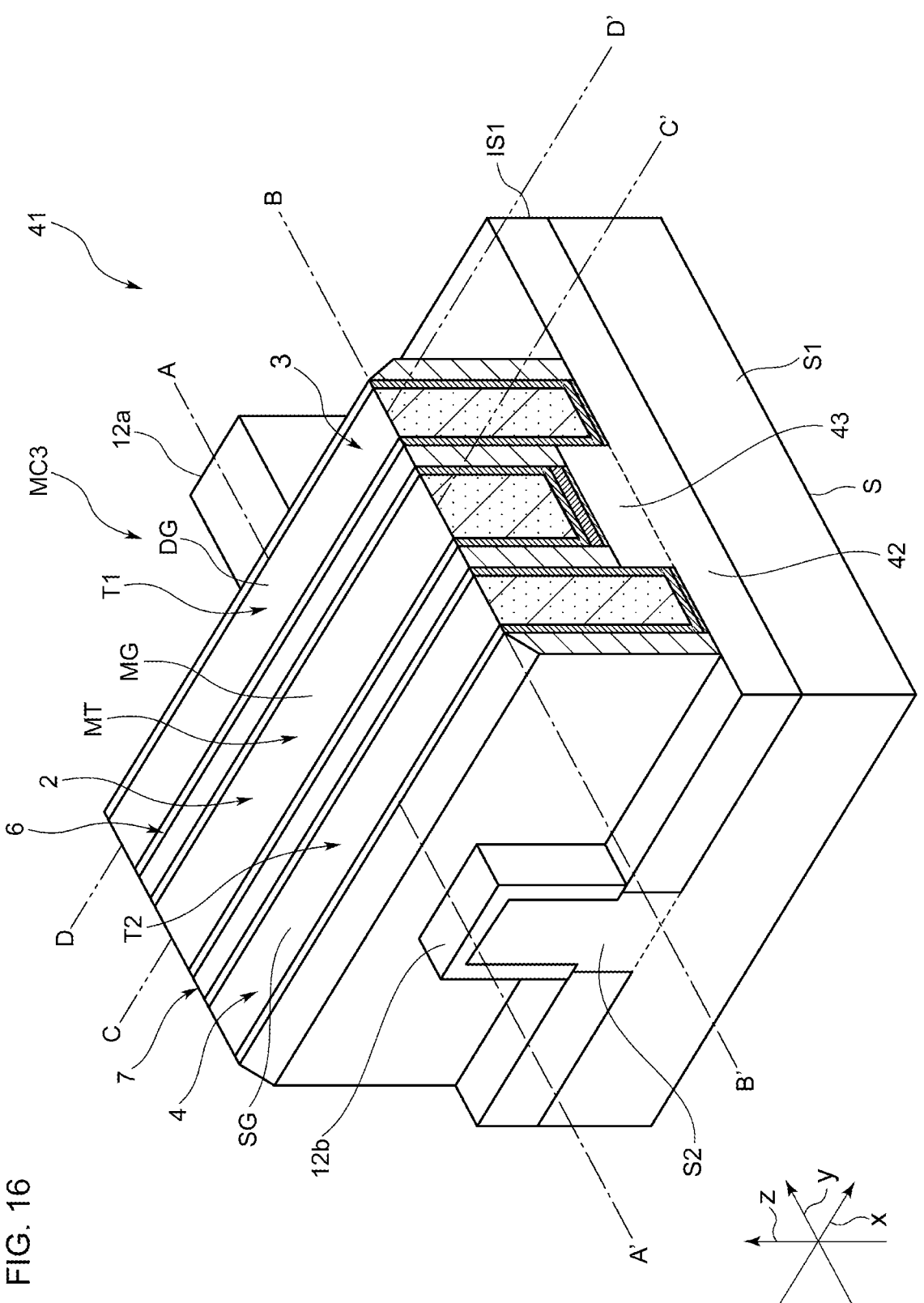
FIG. 16 is a perspective view illustrating configuration (3) of the memory cell.

(9) Memory Cell Including Insulating Layer Having Small Thickness in Regions in which First Select Gate Structure and Second Select Gate Structure are Provided (9-1) Configuration of Memory Cell As illustrated in FIG. 16, in which any corresponding part in FIG. 1 is denoted by an identical reference sign, a memory cell MC3 included in a nonvolatile semiconductor storage device 41 is different from the memory cells according to the above-described embodiments in that the thickness of an insulating layer IS1 is smaller in regions in which the first select gate structure 3 and the second select gate structure 4 are provided than in a region in which the memory gate structure 2 is provided. The following description will be thus made mainly on the insulating layer IS1, but not on any other configuration same as that in the above-described embodiments.

The insulating layer IS1 is provided on the surface of the semiconductor substrate S1, and the fin S2 protrudes from a surface of the insulating layer IS1. In the configuration in which the thickness of the insulating layer IS1 is smaller in the regions in which the first select gate structure 3 and the second select gate structure 4 are provided than in the region in which the memory gate structure 2 is provided, the insulating layer IS1 includes a layered insulating layer 42 disposed on the surface of the semiconductor substrate S1, and a protrusion insulating layer 43 protruding on the layered insulating layer 42 in the region in which the memory gate structure 2 is provided. The protrusion insulating layer 43 is made of an insulative material same as that of the layered insulating layer 42 and integrated with the layered insulating layer 42. The protrusion insulating layer 43 is provided along the memory gate structure 2 and has a longitudinal direction thereof in the x direction intersecting with the longitudinal direction of the fin S2 (the y direction) like the memory gate structure 2.

Figures 17A, 17B:
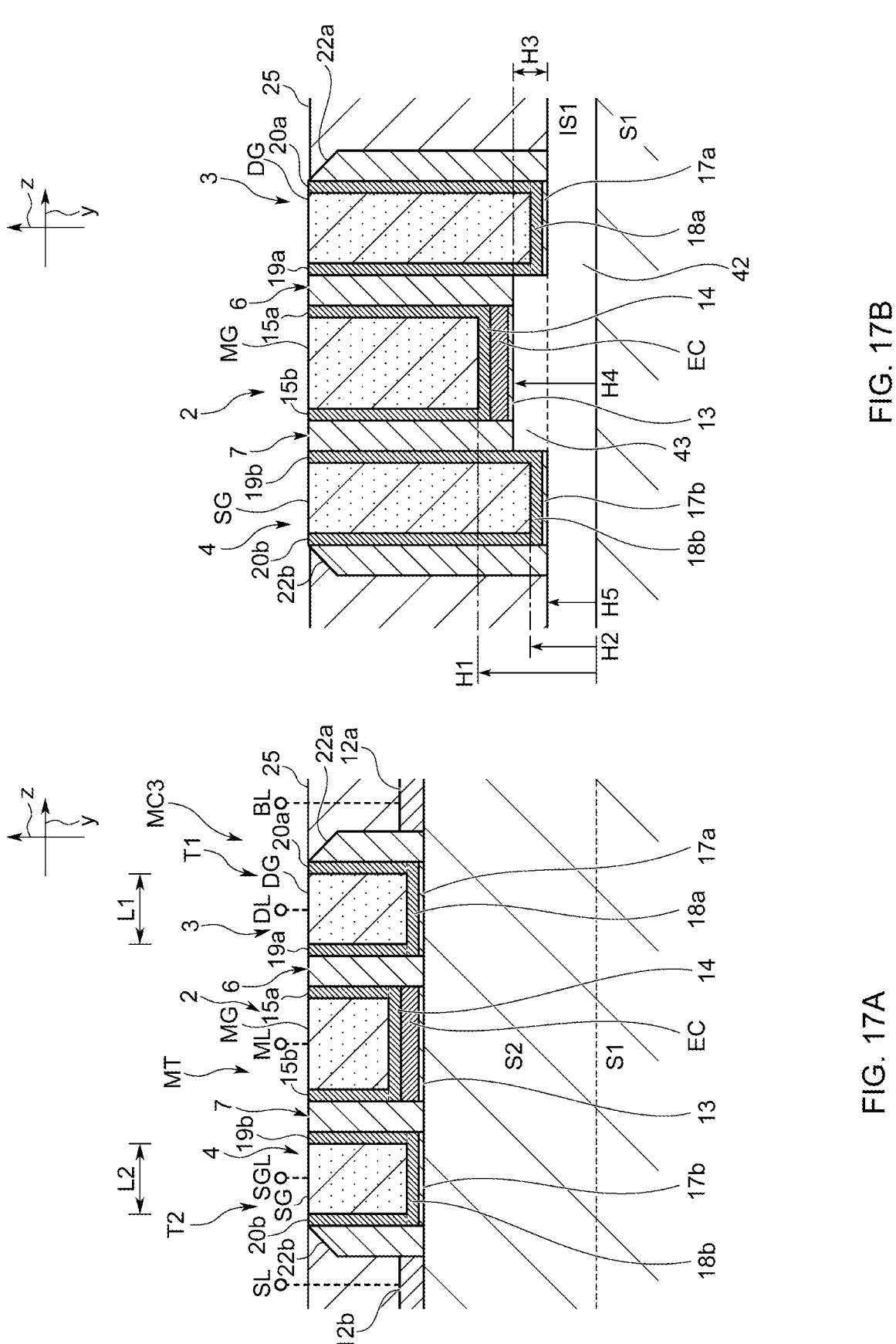
FIG. 17A is a schematic view illustrating a sectional configuration taken along line A-A' in FIG. 16.
FIG. 17B is a schematic view illustrating a sectional configuration taken along line B-B' in FIG. 16.

FIG. 17A, in which any corresponding part to that in FIG. 3A is denoted by an identical reference sign, is a cross-sectional view illustrating a sectional configuration taken along line A-A' in FIG. 16. As illustrated in FIG. 17A, the layered insulating layer 42 and the protrusion insulating layer 43 (FIG. 16) are not provided in a region in which fin S2 is provided, but the first select gate structure 3, the memory gate structure 2 and the second select gate structure 4 are provided on the surface of the fin S2.

FIG. 17B, in which any corresponding part to that in FIG. 3B is denoted by an identical reference sign, is a cross-sectional view illustrating a sectional configuration taken along line B-B' in FIG. 16. As illustrated in FIG. 17B, the first select gate structure 3 and the second select gate structure 4 are provided on the layered insulating layer 42, and the memory gate structure 2 is provided on the protrusion insulating layer 43.

In a region (FIG. 17B) in which the fin S2 is not provided, H5 refers to the distance between the surface of the semiconductor substrate S1 and an upper surface of the layered insulating layer 42 in the regions in which the first select gate structure 3 and the second select gate structure 4 are provided. H4 refers to the distance between the surface of the semiconductor substrate S1 and the upper surface of the protrusion insulating layer 43 in the region in which the memory gate structure 2 is provided. The distance H4 is larger than the distance H5 by a distance H3 as the height of the protrusion insulating layer 43.

The distance H1 between the semiconductor substrate S1 and the lower surface of the memory gate electrode MG is larger than the distance H2 between the semiconductor substrate S1 and the lower surfaces of the first and second select gate electrodes DG and SG by the distance H3 as the thickness of the protrusion insulating layer 43 and, for example, the thickness of the charge storage layer EC. With the configuration, the lower surfaces of the first and second select gate electrodes DG and SG are disposed at low positions closer to the semiconductor substrate S1 than the lower surface of the memory gate electrode MG.

In the memory cell MC3 thus configured, the first and second select transistors T1 and T2 in the regions on the side surfaces of the fin S2 can be reliably controlled to be turned on and off through the first select gate electrode DG and the second select gate electrode SG, the lower surfaces of which are positioned lower than the lower surface of the memory gate electrode MG. Specifically, when gate off voltage is applied to the first select gate electrode DG and the second select gate electrode SG, a non-conductive state can be achieved in the regions on the side surfaces of the fin S2, which are reliably covered by the first select gate electrode DG and the second select gate electrode SG. Accordingly, when information programmed to the memory transistor MT is the low threshold voltage Vth, leakage current can be prevented from flowing between the drain region 12a and the source region 12b along the regions on the side surfaces of the fin S2. As a result, any false operation in the memory cell MC3 can be prevented at data programming operation and data reading operation.

Such a false operation is described in detail in "(2) Detailed configuration of memory cell" above with reference to the "comparative example (not illustrated) in which the distance H1 is smaller than the distance H2 such that the lower surfaces of the first and second select gate electrodes DG and SG are positioned higher than the lower surface of the memory gate electrode MG". Since the comparative example in which the first and second select transistors T1 and T2 cannot be reliably controlled to be turned on and off is described above in "(2) Detailed configuration of memory cell", description thereof will be omitted in the following.

Figure 18B:
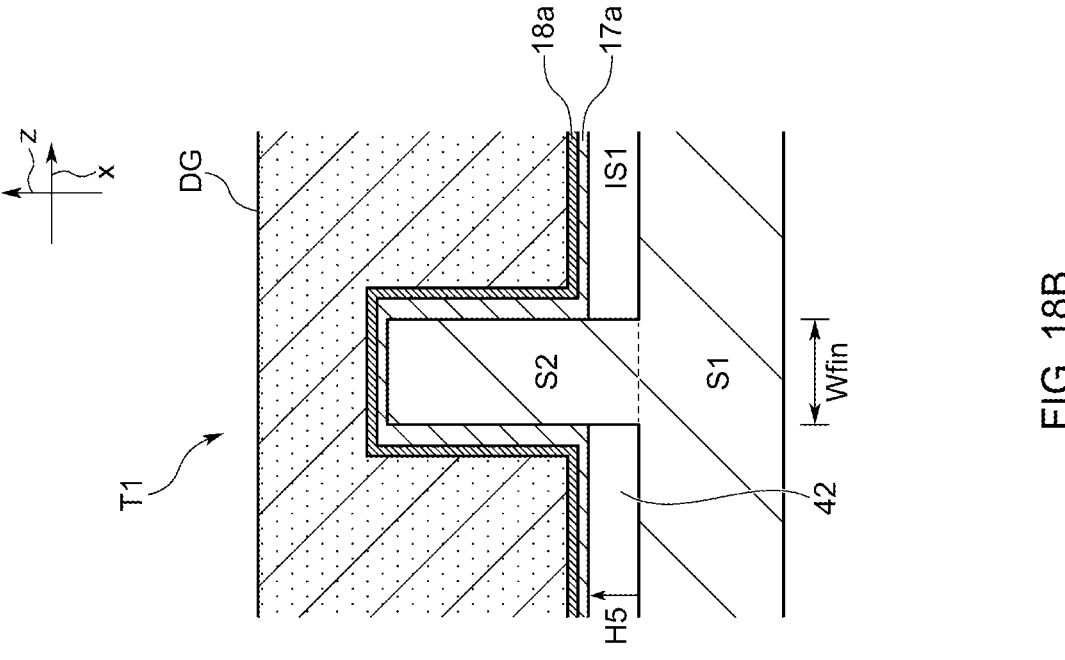
FIG. 18B is a schematic view illustrating a sectional configuration of the memory cell taken along line D-D' in FIG. 16.
Figure 18A:
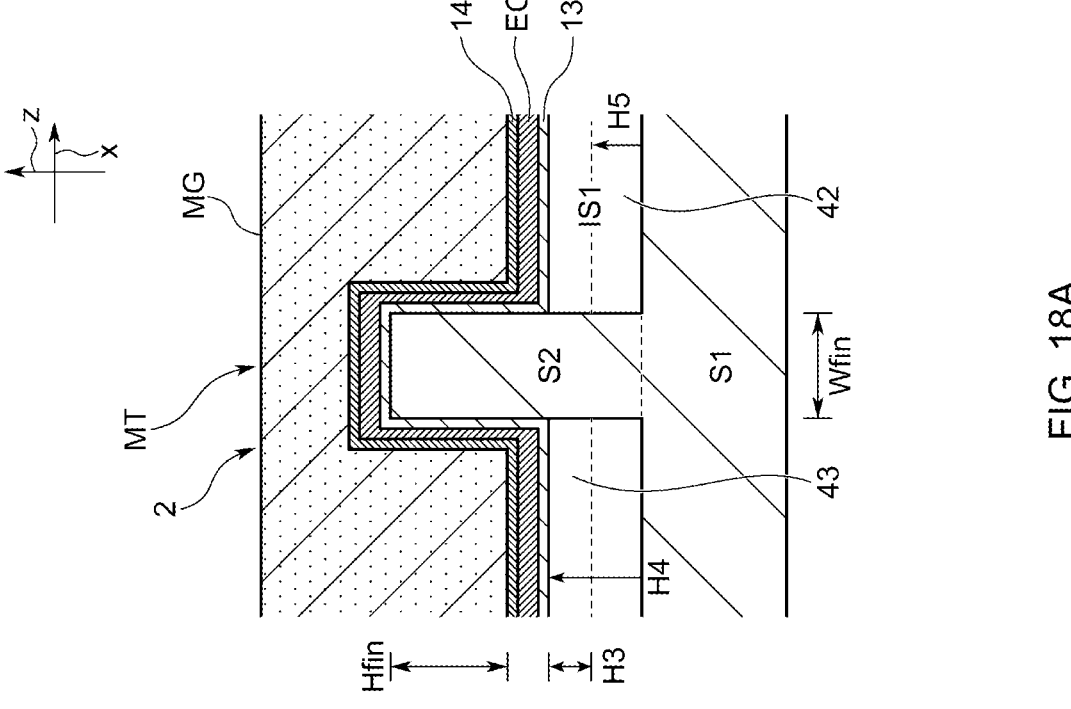
FIG. 18A is a schematic view illustrating a sectional configuration of the memory cell taken along line C-C' in FIG. 16.

The distance H3 as the thickness of the protrusion insulating layer 43 is preferably a half or more of the width Wfin of the fin S2 (FIGS. 18A and 18B). In the fin S2, a region in which the fin S2 (channel layer) cannot be reliably controlled by the gate off voltage applied to the first select gate electrode DG and the second select gate electrode SG potentially remains over a distance of about a half of the width Wfin of the fin S2 from a height at the lower surfaces of the first and second select gate electrodes DG and SG toward the upper surface of the fin S2.

The control of the fin S2 through the gate off voltage can be facilitated by optimizing the impurity concentration inside the fin S2. In this case, however, the impurity concentration inside the fin S2 in regions in which the first and second select transistors T1 and T2 are provided needs to be set to an optimized value different from that in a region in which the memory transistor MT is provided. When the distance H3 as the thickness of the protrusion insulating layer 43 is set to be a half or more of the width Wfin of the fin S2, the region in which the fin S2 (channel layer) cannot be reliably controlled through the gate off voltage is positioned lower than the lower surface of the memory gate electrode MG. The configuration prevents leakage current, which would otherwise cause a false operation, from flowing between the drain region 12a and the source region 12b along the regions on the side surfaces of the fin S2 when information programmed to the memory transistor MT is the low threshold voltage Vth. Accordingly, the false operation prevention is achieved without optimizing, for the control of the fin S2 through the gate off voltage, the impurity concentration inside the fin S2 in the regions in which the first and second select transistors T1 and T2 are provided.

FIG. 18A, in which any corresponding part to that in FIG. 4A is denoted by an identical reference sign, is a cross-sectional view illustrating a sectional configuration taken along line C-C' in FIG. 16. The memory gate structure 2 is disposed over the fin S2 on the protrusion insulating layer

43. With the configuration, the memory gate structure 2 includes the channel layer of the memory transistor MT along the surface of the fin S2 surrounded by the memory gate structure 2.

In the memory gate structure 2 thus configured in the present embodiment, too, the gate width of the memory transistor MT extends along the surface of the fin S2 surrounded by the memory gate structure 2 such that the heights of the side surfaces of the fin S2 serve as part of the gate width. The configuration leads to reduction of the formation area of the memory transistor MT.

FIG. 18B, in which any corresponding part to that in FIG. 4B is denoted by an identical reference sign, is a cross-sectional view illustrating a sectional configuration taken along line D-D' in FIG. 16. As illustrated in FIG. 18B, in the region in which the first select gate structure 3 is provided, the protrusion insulating layer 43 is not provided on the layered insulating layer 42 so that the first select gate structure 3 is disposed over the fin S2 on the layered insulating layer 42. With the configuration, the first select gate structure 3 surrounds the surface of the fin S2, and the channel layer of the first select transistor T1 is disposed along the surface of the fin S2 surrounded by the first select gate structure 3.

In this manner, in the present embodiment, too, the gate width of the first select transistor T1 extends along the surface of the fin S2 surrounded by the first select gate structure 3 such that the heights of the side surfaces of the fin S2 serve as part of the gate width. The configuration leads to reduction of the formation area of the first select transistor T1. In addition, the gate width of the first select transistor T1 is twice larger than the distance H3 as the thickness of the protrusion insulating layer 43, which leads to increase of on-current of the first select transistor T1, thereby achieving a faster operation. The second select gate structure 4 is provided over the fin S2 on the layered insulating layer 42 and has a configuration same as that of the first select gate structure 3 illustrated in FIG. 18B, and thus description thereof will be omitted in the following.

The same above description of "(3) Circuit configuration of nonvolatile semiconductor storage device" and "(4) Voltage at various operations in nonvolatile semiconductor storage device" applies to the memory cell MC3 according to the present embodiment, and thus is not given in the following.

The insulating layer IS1 including the protrusion insulating layer 43 disposed on the layered insulating layer 42 may be manufactured, for example, in the sidewall spacer formation process. Specifically, while forming the sidewall-shaped sidewall spacers 6 and 7 by forming layered insulating films and etching back, the insulating layer IS being externally exposed may be removed by over-etching by the distance H3 as the height of the protrusion insulating layer 43.

(9-2) Operations and Effects

When data programming is prevented by preventing charge injection into the charge storage layer EC in the memory cell MC3 having the above-described configuration according to the present embodiment, similarly to the above-described embodiments, a depleted layer is formed entirely inside the fin S2 surrounded by the memory gate structure 2 to reduce the potential difference between the memory gate electrode DG and the fin S2. Thus, when the memory cell MC3 is downsized by reducing the distance between the drain region 12*a* and the source region 12*b* on the surface of the fin S2 with a high impurity concentration inside the fin S2, the potential difference between the memory gate electrode DG and the fin S2 can be reduced by setting the shape (height and width) of the fin S2 so that a depleted layer is formed entirely inside the fin S2, and the occurrence of disturbance can be suppressed by reducing electric field applied to the depleted layer. Accordingly, the memory cell MC3 achieves downsizing and suppression of the occurrence of disturbance.

In addition, the memory cell MC3 includes the insulating layer IS1 with which the distance H4 between the semiconductor substrate S1 and the lower surface of the lower memory gate insulating film 13 is larger than the distance H5 between the semiconductor substrate S1 and the lower surfaces of the first and second select gate insulating films 17*a* and 17*b*. With the configuration, the lower surfaces of the first and second select gate electrodes DG and SG are positioned closer to the semiconductor substrate S1 than the lower surface of the memory gate electrode MG in a region in which the insulating layer IS1 is provided.

In the memory cell MC3 thus configured, the first and second select transistors T1 and T2 in the regions on the side surfaces of the fin S2 can be more reliably controlled to be turned on and off by the first select gate electrode DG and the second select gate electrode SG, the lower surfaces of which are positioned lower than the lower surface of the memory gate electrode MG. As a result, any false operation in the memory cell MC3 can be more reliably prevented due to the protrusion insulating layer 43 at data programming operation and data reading operation than in the above-described embodiments.

Figure 19:
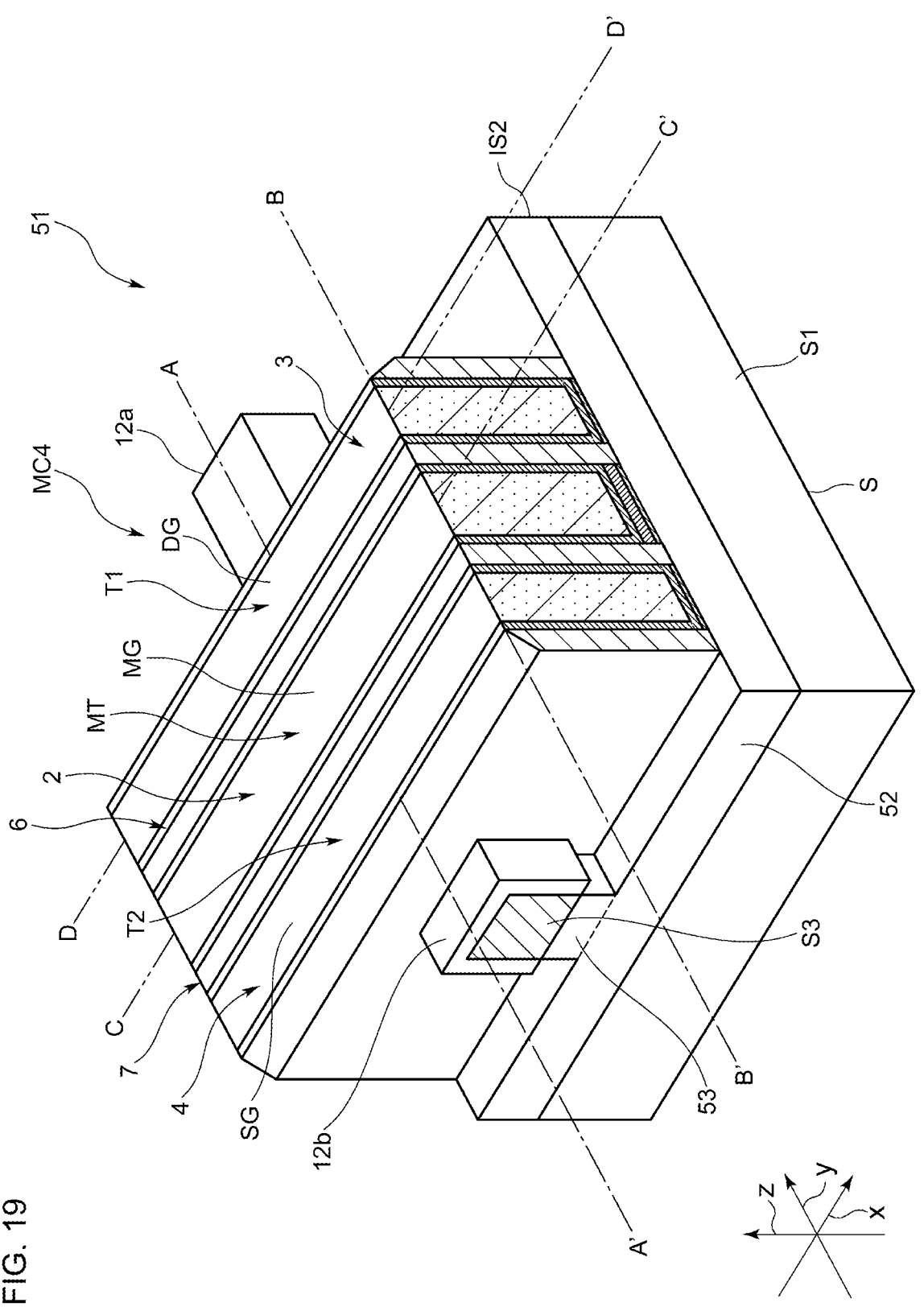
FIG. 19 is a perspective view illustrating configuration (4) of the memory cell.

(10) Memory Cell Including Fin on Insulating Layer (10-1) Configuration of Memory Cell As illustrated in FIG. 19, in which any corresponding part in FIG. 1 is denoted by an identical reference sign, a memory cell MC4 included in a nonvolatile semiconductor storage device 51 is different from the memory cells according to the above-described embodiments in the configuration of a fin S3. The following description will be made mainly on the fin S3, but not on any other configuration same as that in the above-described embodiments.

The nonvolatile semiconductor storage device 51 includes an insulating layer IS2 on the semiconductor substrate S1, and the fin S3 extending in the y direction is provided on the insulating layer IS2. The insulating layer IS2 includes a layered insulating layer 52 and a strip-shaped lower insulating layer 53 on the semiconductor substrate S1. The lower insulating layer 53 is made of an insulative material same as that of the layered insulating layer 52 and integrated with the layered insulating layer 52. The lower insulating layer 53 extends in the y direction and is provided with the fin S3 on a surface thereof. Although referred to as a "fin" in the present embodiment like the other embodiments, the portion S3 illustrated in FIG. 19 does not have a fin shape coupled with the semiconductor substrate S1 like the fin S2 illustrated in FIG. 1, but has a horizontal column shape or a beam shape (joist shape) extending in the y direction.

The fin S3 is made of a semiconductor material and extends along the lower insulating layer 53. In a configuration in which the lower insulating layer 53 is provided, the width of the fin S3 in a direction (the x direction) orthogonal to a longitudinal direction (the y direction) in which the fin S3 extends and a height direction (the z direction) is set to be equal to or smaller than the width of the lower insulating layer 53 so that the fin S3 is provided only on the lower insulating layer 53.

Although not illustrated in FIG. 19, an upper insulating layer 54 (to be described later with reference to FIGS. 20A and 21) is provided on the upper surface of the fin S3 on which the memory cell MC4 is provided. With the configuration, the fin S3 is sandwiched between the insulating layers on the upper and lower surfaces thereof.

The drain region 12a is provided adjacent to the first select gate structure 3 on the surface of the fin S3, and the source region 12b is provided adjacent to the second select gate structure 4 on the surface of the fin S3. In the present embodiment, the upper insulating layer 54 is not provided on the upper surface of the fin S3 where the memory cell MC4 is not provided, so that the drain region 12a and the source region 12b are disposed on the surface of the fin S3.

Figures 20A, 20B:
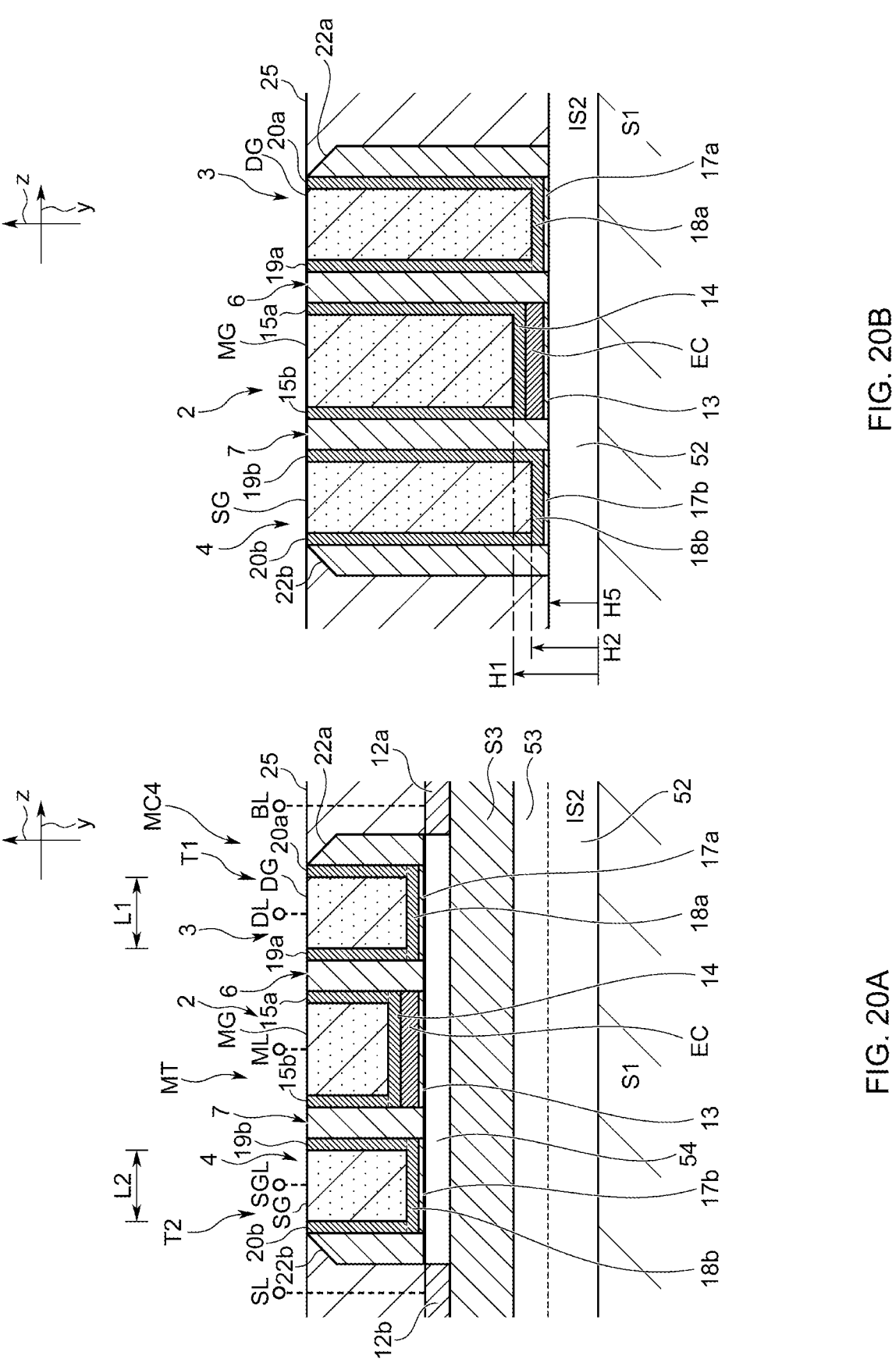
FIG. 20A is a schematic view illustrating a sectional configuration taken along line A-A' in FIG. 19.
FIG. 20B is a schematic view illustrating a sectional configuration taken along line B-B' in FIG. 19.

FIG. 20A, in which any corresponding part to that in FIG. 3A is denoted by an identical reference sign, is a cross-sectional view illustrating a sectional configuration taken along line A-A' in FIG. 19. As illustrated in FIG. 20A, the upper insulating layer 54 is provided in regions of the surface of the fin S3 in which the memory gate structure 2, the first select gate structure 3, the second select gate structure 4, the sidewall spacers 6 and 7, and the sidewall parts 22a and 22b are provided.

With the configuration, the fin S3 is sandwiched between the insulating layer IS2 (in the present embodiment, the lower insulating layer 53) and the upper insulating layer 54 in the regions in which the memory gate structure 2, the first select gate structure 3, the second select gate structure 4, the sidewall spacers 6 and 7, and the sidewall parts 22a and 22b are provided.

FIG. 20B, in which any corresponding part to that in FIG. 3B is denoted by an identical reference sign, is a cross-sectional view illustrating a sectional configuration taken along line B-B' in FIG. 19. As illustrated in FIG. 20B, in a region in which the fin S3 is not provided, the memory gate structure 2, the first select gate structure 3, the second select gate structure 4, the sidewall spacers 6 and 7, and the sidewall parts 22a and 22b are disposed on the layered insulating layer 52 of the insulating layer IS2 covering the semiconductor substrate S1.

Figure 21B:
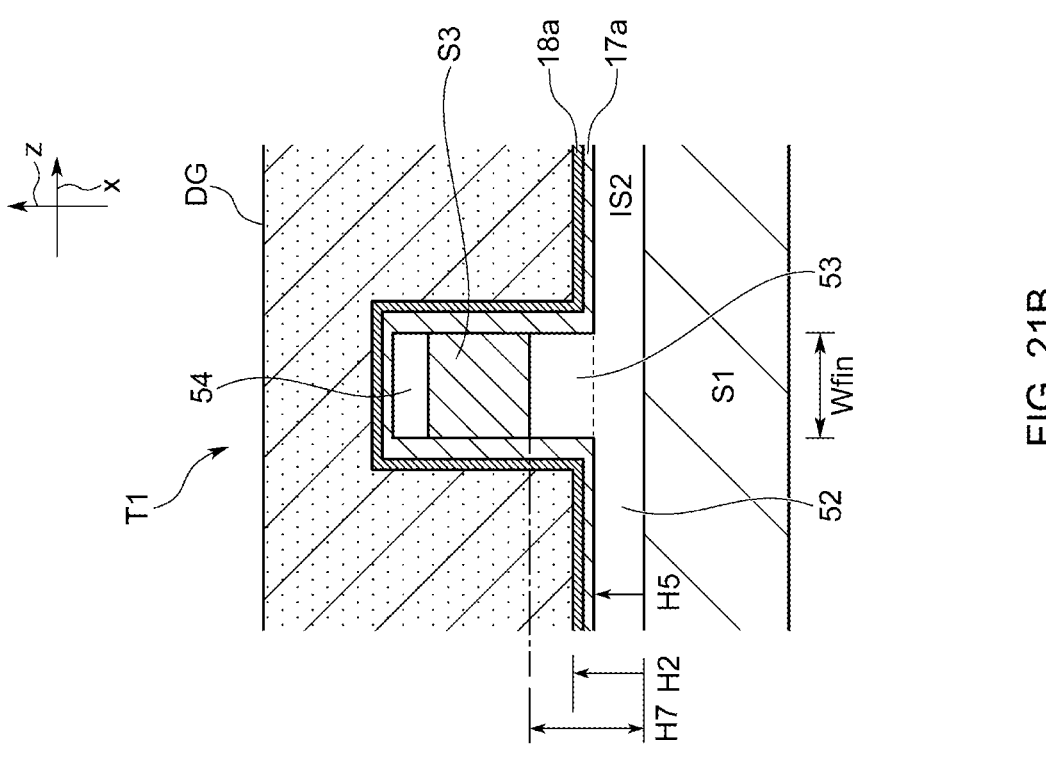
FIG. 21B is a schematic view illustrating a sectional configuration of the memory cell taken along line D-D' in FIG. 19.
Figure 21A:
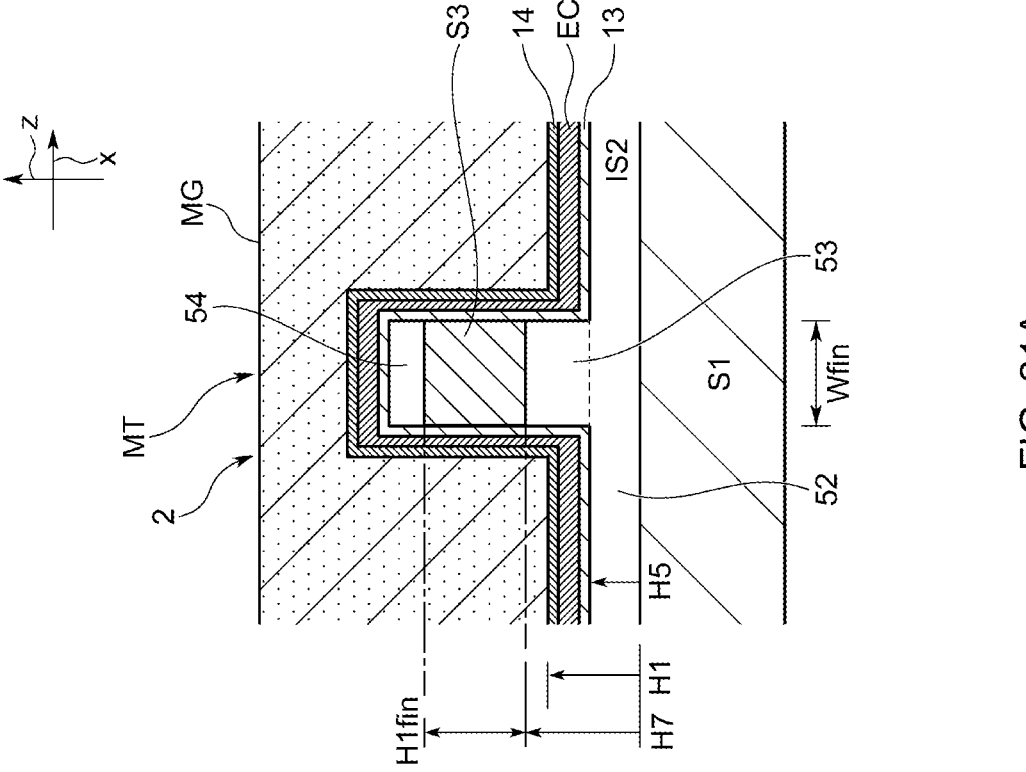
FIG. 21A is a schematic view illustrating a sectional configuration of the memory cell taken along line C-C' in FIG. 19.

FIG. 21A, in which any corresponding part to that in FIG. 4A is denoted by an identical reference sign, is a cross-sectional view illustrating a sectional configuration taken along line C-C' in FIG. 19. In the present embodiment, as illustrated in FIG. 21A, the fin S3 is sandwiched between the upper insulating layer 54 and the insulating layer IS2 (in the present embodiment, the lower insulating layer 53) on the upper and lower surfaces thereof and surrounded by the memory gate electrode MG on side surfaces thereof. With the configuration, the channel layer of the memory transistor MT is formed on the side surfaces of the fin S3. Since the fin S3 is sandwiched between the upper insulating layer 54 and the insulating layer IS2 (in the present embodiment, the lower insulating layer 53) on the upper and lower surfaces thereof, the memory transistor MT is a fully-depleted transistor. In the present embodiment, the relation of Hfin>Wfin holds where H1fin represents the height of the fin S3.

In the present embodiment, as illustrated in FIG. 21A, a distance H7 between the semiconductor substrate S1 and the lower surface of the fin S3 is set to be larger than the distance H1 between the semiconductor substrate S1 and the lower surface of the memory gate electrode MG in the region in which the fin S3 is not provided. Accordingly, the lower surface of the memory gate electrode is positioned lower than the lower surface of the fin S3 so that the memory gate electrode MG completely covers the side surfaces of the fin S3. The configuration prevents leakage current, which would otherwise cause a false operation, from flowing between the drain region 12a and the source region 12b along regions on the side surfaces of the fin S3.

The distance H7 between the semiconductor substrate S1 and the lower surface of the fin S3 desirably differs from the distance H1 between the semiconductor substrate S1 and the lower surface of the memory gate electrode MG by an half or more of the width Wfin of the fin S3. A configuration in which the lower insulating layer 53 is not provided will be described later.

FIG. 21B, in which any corresponding part to that in FIG. 4B is denoted by an identical reference sign, is a cross-sectional view illustrating a sectional configuration taken along line D-D' in FIG. 19. The fin S3 is sandwiched between the upper insulating layer 54 and the insulating layer IS2 (in the present embodiment, the lower insulating layer 53) on the upper and lower surfaces thereof and surrounded by the first select gate electrode DG on the side surfaces thereof. With the configuration, the channel layer of the first select transistor T1 is formed on the side surfaces of the fin S3. Since the fin S3 is sandwiched between the upper insulating layer 54 and the insulating layer IS2 (in the present embodiment, the lower insulating layer 53) on the upper and lower surfaces thereof and thus insulated from the semiconductor substrate S1, the first select transistor T1 is a fully-depleted transistor.

In the present embodiment, as illustrated in FIG. 21B, the distance H7 between the semiconductor substrate S1 and the lower surface of the fin S3 is set to be larger than the distance H2 between the semiconductor substrate S1 and the lower surface of the first select gate electrode DG in the region in which the fin S3 is not provided. Accordingly, the lower surface of the first select gate electrode DG is positioned lower than the lower surface of the fin S3 so that the first select gate electrode DG completely covers the side surfaces of the fin S3. The configuration prevents leakage current flow along the regions on the side surfaces of the fin S3.

The second select gate structure 4 is provided over the fin S3 on the layered insulating layer 42 and has a configuration same as that of the first select gate structure 3 illustrated in FIG. 21B, and thus description thereof will be omitted in the following.

The distance H7 between the semiconductor substrate S1 and the lower surface of the fin S3 desirably differs from the distance H2 between the semiconductor substrate S1 and the lower surface of the first select gate electrode DG by an half or more of the width Wfin of the fin S3. The configuration in which the lower insulating layer 53 is not provided will be described later.

The same above description of "(3) Circuit configuration of nonvolatile semiconductor storage device" and "(4) Voltage at various operations in nonvolatile semiconductor storage device" applies to the memory cell MC4 according to the present embodiment, and thus is not given in the following.

The memory cell MC4 including the fin S3 on the insulating layer IS1 may be manufactured by sequentially stacking a semiconductor substrate, an insulating layer, a semiconductor layer to be formed into a fin, and an insulating layer to be formed into an upper insulating layer, before the fin formation process illustrated in FIG. 8, and then fabricating, in the fin formation process, parts of the semiconductor layer to be formed into a fin and the insulating layer by using, as a hard mask, the patterned insulating layer to be formed into an upper insulating layer. Alternatively, a silicon-on-insulator (SOI) substrate may be used as the semiconductor substrate, the insulating layer, and the semiconductor layer to be formed into a fin.

(10-2) Operations and Effects

When data programming is prevented by preventing charge injection into the charge storage layer EC in the memory cell MC4 having the above-described configuration, the occurrence of disturbance can be suppressed according to a principle same as that in the above-described embodiments by reducing the potential difference between the memory gate electrode DG and the fin S3 and reducing electric field applied to a depleted layer. Accordingly, the memory cell MC 4 achieves downsizing and suppression of the occurrence of disturbance.

In addition, the memory transistor MT, the first select transistor T1, and the second select transistor T2 of the memory cell MC4 can operate as fully-depleted transistors since the fin S3 is sandwiched between the upper insulating layer 54 and the insulating layer IS2 (in the present embodiment, the lower insulating layer 53) on the upper and lower surfaces thereof. In this case, the fin S3 is insulated from the semiconductor substrate S1, and thus potential at the fin S3 is independent from the semiconductor substrate S1. Accordingly, the potential difference between the memory gate electrode MG and the fin S3 can be further reduced, and electric field applied to the depleted layer can be further reduced, which leads to further suppression of the occurrence of disturbance as compared to the above-described fin type (fin S2).

In the memory cell MC4, the lower surfaces of the memory gate electrode MG, the first select gate electrode DG, and the second select gate electrode SG are positioned lower than the lower surface of the fin S3 so that the memory gate electrode MG, the first select gate electrode DG, and the second select gate electrode SG completely cover the side surfaces of the fin S3 to prevent leakage current flow along the regions on the side surfaces of the fin S3.

Since the memory cell MC4 includes the upper insulating layer 54 covering the upper surface of the fin S3, the upper insulating layer 54 can prevent concentration of electric field around sharp corners at intersections of the upper and side surfaces of the fin S3 at, for example, data programming operation. The configuration can prevent a programming defect that charge cannot be injected into the charge storage layer along a fin sidewall due to the concentration of electric field around the corners at programming.

(10-3) Fin According to Other Embodiments

In the above-described embodiments, the distance H7 between the semiconductor substrate S1 and the lower surface of the fin S3 is larger than the distance H1 between the semiconductor substrate S1 and the lower surface of the memory gate electrode MG in the region in which the fin S3 is not provided (H7>H1), but the present invention is not limited thereto. The distance H7 between the semiconductor substrate S1 and the lower surface of the fin S3 may be equal to or smaller than the distance H1 between the semiconductor substrate S1 and the lower surface of the memory gate electrode DG in the region in which the fin S3 is not provided (H7≤H1).

For example, when the lower insulating layer 53 is provided on the layered insulating layer 52, the distance H7 between the semiconductor substrate S1 and the lower surface of the fin S3 may be larger than the distance H5 between the semiconductor substrate S1 and the surface of the layered insulating layer 52 and smaller than the distance H1 between the semiconductor substrate S1 and the lower surface of the memory gate electrode MG illustrated in FIG. 21A (H5<H7<H1).

In the above-described embodiments, the lower insulating layer 53 protruding from the layered insulating layer 52 is provided on the layered insulating layer 52, and the layered insulating layer 52, the lower insulating layer 53, the fin S3, and the upper insulating layer 54 are stacked in this order on the semiconductor substrate S1, but the present invention is not limited thereto. The layered insulating layer 52, the fin S3, and the upper insulating layer 54 may be stacked in this order on the semiconductor substrate S1 without the lower insulating layer 53. In this case, the lower surface of the fin S3 may be positioned flush with the surface of the layered insulating layer 52.

In the above-described embodiments, the upper insulating layer 54 is provided on the fin S3, and the insulating layer IS2, the fin S3, and the upper insulating layer 54 are stacked in this order on the semiconductor substrate S1, but the present invention is not limited thereto. The insulating layer IS2 and the fin S3 may be stacked in this order on the semiconductor substrate S1 without the upper insulating layer 54.

In the embodiments illustrated in FIGS. 16 and 19, the memory gate electrode MG, the first select gate electrode DG, and the second select gate electrode SG are each made of a metallic material, but the present invention is not limited thereto. As described above with reference to FIG. 12, the memory gate electrode MG, the first select gate electrode DG, and the second select gate electrode SG may be each made of a conductive material (for example, polysilicon) other than a metallic material. In this case, for example, a layered electrode formation layer is etched back to form the first select gate electrode DG1 and the second select gate electrode SG1 sidewall-shaped along the sidewall spacers 6 and 7 on the sidewalls of the memory gate structure 2*a* through the manufacturing process of the memory cells MC3 and MC4 illustrated in FIGS. 16 and 19.

REFERENCE SIGNS LIST

1, 31, 41, 51 nonvolatile semiconductor storage device
MC, MC11, MC12, . . . , MC1*n*, MC21, MC22, . . . , MC2*n*, MCm1, MCm2, . . . , MCmn, MC1, MC2, MC3, MC4 memory cell
2, 2*a* memory gate structure
3, 3*a* first select gate structure
4, 4*a* second select gate structure
12*a*, 40*a* drain region
12*b*, 40*b* source region
6, 7 sidewall spacer
13 lower memory gate insulating film
14, 14*a* upper memory gate insulating film
EC charge storage layer
17*a*, 18*a* first select gate insulating film
17*b*, 18*b* second select gate insulating film
S1 semiconductor substrate
S2, S3 fin
IS, IS1, IS2 insulating layer
42, 52 layered insulating layer
43 protrusion insulating layer
53 lower insulating layer
54 upper insulating layer

What is claimed is:

1. A memory cell comprising:
a semiconductor substrate covered by an insulating layer;
a fin disposed on the insulating layer;
a memory gate structure including a lower memory gate insulating film, a charge storage layer, an upper memory gate insulating film, and a memory gate electrode stacked, and being disposed on the insulating layer so as to extend over the fin;

a first sidewall spacer disposed on one sidewall of the memory gate structure;

a second sidewall spacer disposed on another sidewall of the memory gate structure;

a first select gate structure including a first select gate electrode stacked on a first select gate insulating film, and being disposed on the insulating layer so as to extend over the fin along the first sidewall spacer;

a second select gate structure including a second select gate electrode stacked on a second select gate insulating film, and being disposed on the insulating layer so as to extend over the fin along the second sidewall spacer;

a drain region provided adjacent to the first select gate structure on a surface of the fin, insulated from the first select gate electrode, and electrically connected with a bit line; and a source region provided adjacent to the second select gate structure on the surface of the fin, insulated from the second select gate electrode, and electrically connected with a source line, wherein:

the first select gate structure, the memory gate structure, and the second select gate structure are provided between the drain region and the source region, an upper insulating layer is provided on an upper surface of the fin in a region where the memory gate structure, the first sidewall spacer, the first select gate structure, the second sidewall spacer, and the second select gate structure are provided, a first select gate sidewall insulating film is provided between the first select gate electrode and the first sidewall spacer, the first select gate sidewall insulating film being formed along the first sidewall spacer and being integrally formed with the first select gate insulating film, a second select gate sidewall insulating film is provided between the second select gate electrode and the second sidewall spacer, the second select gate sidewall insulating film being formed along the second sidewall spacer and being integrally formed with the second select gate insulating film, and the insulating layer includes:

a layered insulating layer provided on the semiconductor substrate; and a lower insulating layer that is provided on the layered insulating layer, made of a material same as a material of the layered insulating layer, and integrated with the layered insulating layer, and on a surface of which the fin is provided, the layered insulating layer, the lower insulating layer, the fin, and the upper insulating layer are stacked in this order on the semiconductor substrate, and the layered insulating layer is wider than the lower insulating layer, the width being a direction orthogonal to a longitudinal direction in which the fin extends and orthogonal to a stacking direction of the layered insulating layer, the lower insulating layer, the fin, and the upper insulating layer.

2. The memory cell according to claim 1, wherein a distance between a surface of the semiconductor substrate and a lower surface of the fin is larger than a distance between the surface of the semiconductor substrate and a surface of the layered insulating layer in a region in which the fin is not provided.

3. The memory cell according to claim 1, wherein the memory gate electrode, the first select gate electrode, and the second select gate electrode contain metallic material.

4. The memory cell according to claim 1, wherein the first select gate electrode is sidewall-shaped along the first sidewall spacer, and the second select gate electrode is sidewall-shaped along the second sidewall spacer.

5. A nonvolatile semiconductor storage device comprising a plurality of memory cells arranged in a matrix of rows and columns and each including a memory gate electrode connected with a memory gate line, wherein each memory cell is the memory cell according to claim 1, and the memory gate line is shared by the memory cells arranged in the matrix.

6. The memory cell according to claim 1, wherein a relation of H1fin>Wfin holds where H1fin represents a height of the fin as a distance between an upper surface of the lower insulating layer and a bottom surface of the upper insulating layer, and Wfin represents a width of the fin in a direction in which the first select gate structure and the second select gate structure extend over the fin.

7. The memory cell according to claim 1, wherein in a region in which the fin is not provided, the layered insulating layer covers the semiconductor substrate, and the memory gate structure, the first sidewall spacer, the first select gate structure, the second sidewall spacer, and the second select gate structure are disposed on the layered insulating layer.

8. The memory cell according to claim 1, wherein:

the first sidewall spacer is made of an insulative material having a specific dielectric constant smaller than that of the first select gate sidewall insulating film, and the second sidewall spacer is made of an insulative material having a specific dielectric constant smaller than that of the second select gate sidewall insulating film.

* * * * *